United States Patent
Dilger et al.

[11] Patent Number: 5,989,947
[45] Date of Patent: Nov. 23, 1999

[54] METHOD FOR THE MANUFACTURE OF QUANTUM STRUCTURES, IN PARTICULAR QUANTUM DOTS AND TUNNEL BARRIERS AS WELL AS COMPONENTS WITH SUCH QUANTUM STRUCTURES

[75] Inventors: Markus Dilger, Kirchheim; Karl Eberl, Weil der Stadt; Rolf Haug; Klaus v. Klitzing, both of Stuttgart, all of Germany

[73] Assignee: Max-Planck-Geselleschaft Zur, Munich, Germany

[21] Appl. No.: 08/665,807

[22] Filed: Jun. 19, 1996

[30] Foreign Application Priority Data

Jun. 20, 1995 [DE] Germany .................. 195 22 351

[51] Int. Cl.⁶ .................. H01L 21/335; H01L 21/778
[52] U.S. Cl. .................. 438/172; 438/483; 438/702
[58] Field of Search .................. 438/39, 40, 41, 438/46, 47, 172, 212, 197, 962, 483, 701, 702; 257/194, 17, 22, 24, 192

[56] References Cited

U.S. PATENT DOCUMENTS

| | | | |
|---|---|---|---|
| 5,313,684 | 5/1994 | Arimoto | 372/45 |
| 5,436,191 | 7/1995 | Paell et al. | 638/46 |
| 5,607,876 | 3/1997 | Biengelsew et al. | 257/17 |
| 5,656,821 | 8/1997 | Sakuma | 257/17 |
| 5,701,017 | 12/1997 | Patel et al. | 257/27 |
| 5,739,056 | 4/1998 | Tiwari et al. | 438/172 |
| 5,770,475 | 6/1998 | Kim et al. | 438/47 |
| 5,827,754 | 10/1998 | Min et al. | 438/40 |
| 5,828,076 | 10/1998 | Gossner et al. | 638/212 |

FOREIGN PATENT DOCUMENTS

4218650 A1  12/1993  Germany .

OTHER PUBLICATIONS

Weisbuch, Claude, *Quantum Semiconductor Structures*. Acad. Press, Inc., 1991, pp. 189–215.

Nakamura, Y., et al., "Modulation of one–dimensional electron density m n–AlGaAs/GaAs edge quantum wire transistor", *Appl. Phys. Lett* 64(19), May 9, 1994, pp. 2552–2554.

Fukui, T., et al., "GaAs tetrahedral quantum dot structures fabricated using selective area metalorganic chemical vapor deposition", *Appl. Phys. Lett* 58(18) May 6, 1991, pp. 2018–2020.

Tan, I–Hsing et al., "Systematic observation of strain–induced lateral quantum confinement in GaAs quantum well wires prepared by chemical dry etching", *Appl. Phys. Lett.* 59(15), Oct. 7, 1991, pp. 1875–1877.

Yuh, Perg–fei, et al., "One–dimensional transport in quantum well wire–high electron mobility transistor", *Appl. Phys. Lett* 49(25), Dec. 22, 1986, pp. 1738–1740.

*Primary Examiner*—Savitri Mulpuri
*Attorney, Agent, or Firm*—Townsend and Townsend and Crew LLP

[57] ABSTRACT

A method of manufacturing quantum structures, in particular quantum dots and tunnel barriers and also a component with such quantum structures wherein in that a substrate is structured by the intentional formation of trenches so that material remains between oppositely disposed trench sections, with a transition from a broader region to a narrower region; wherein further material is deposited onto the substrate so that differential growth sets in on the remaining regions of the substrate and an inclined surface arises in the transition region between the broader region and the narrower region and a material height increase arises in the narrower region relative to the broader region; and wherein a different material, or a material of different conductivity, is subsequently deposited, whereby a tunnel barrier arises on the inclined surface and/or a quantum dot arises at the upper end of the inclined surface.

36 Claims, 21 Drawing Sheets tunnel barrier on inclined surface:

principle A: growth over edges tunnel barrier controllable by back-gate or top-gate quantum dots at narrow points of V-trenches (grooves)

equivalent circuit diagram:

example: optical detector

METHOD FOR THE MANUFACTURE OF QUANTUM STRUCTURES, IN PARTICULAR QUANTUM DOTS AND TUNNEL BARRIERS AS WELL AS COMPONENTS WITH SUCH QUANTUM STRUCTURES

FIELD OF THE INVENTION

The present invention relates to methods for manufacturing quantum structures, in particular quantum dots and tunnel barriers, and also components with such quantum structures.

DESCRIPTION OF TECHNICAL BACKGROUND AND PRIOR ART

Substantial interest exists in the manufacturing of so-called single-electron transistors which, among other things, have great potential for use in integrated circuits. A precondition for the realization of a so-called single electron transistor is the provision of a quantum dot, i.e. of a region in which the charge carriers are surrounded in all directions by potential barriers and which have quantized energy levels.

Through the use of single electron transistors it is possible to realize novel logic and memory circuits which make it possible to carry out complicated combinations of data which are not possible in standard logic circuits. Furthermore, the possibility exists of storing and processing individual bits in the form of single electrons. In addition, applications in electrometers and detectors are possible. The spectrum of use thus extends from large computers to the mobile telephone. The market potential of individual electron transistors can be seen from the fact that all major companies in the semiconductor industries worldwide are active in this field and that practically all kinds of integrated circuits (ICs) can be considered as an area of use.

For the industrial application, the active quantum dots in individual electron transistors must satisfy the following definitive requirements:

A. They should be manufacturable by a process which is as simple as possible and which is built up essentially of standard process steps of component manufacture and they should be combinable with the customary semiconductor technology, i.e. integratable into complex circuits.

B. The active quantum dots should be capable of being controlled by only one gate because in this way a maximum packing density can be achieved on the chip.

C. The contacting of the feedlines to the quantum dots should be capable of being realized simply.

D. The structure size of the quantum dots should lie in the nanometer range, with the manufacture being reproducible. The boundary surfaces of the active quantum dots should be atomically smooth so that the individual electrons and transistors can also be operated at higher temperatures, i.e. at temperatures above 77° K., and preferably at ambient temperature.

Having regard to the prior art, reference is made to the following publications:

(1) Y. Nagamune et al.
   Single electron transport and current quantization in a novel quantum dot structure
(2) R. P. Taylor et al.
   Fabrication of nanostructures with multilevel architecture (3) T. Fujisawa et al.
   AlGaAs/InGaAs/GaAs single electron transistors fabricated by focused ion beam implantation
(4) Y. Takahashi et al.
   Conductance Oscillations of a Si Single Electron Transistors at Room Temperature.

Summarizing, the following can be said with regard to the points A) to D):

With respect to A): No method has hitherto been known which permits the defined manufacture of quantum dots without the use of electron beam lithography or FIB plants (FIB=Focused Ion Beam). These methods are, on the one hand, not standard methods for the manufacture of components and, on the other hand, the use of this method is always associated with damage to the material as is evident from the documents (1), (2) and (3).

With regard to B): As a rule, the active quantum dots of individual electrons and transistors are defined by the application of voltage to several gates, whereby the space requirement and the susceptibility of the structures to breakdown increases greatly. Furthermore, it is technologically very difficult to stabilize the numerous gate voltages. In this connection, reference is again made to the documents (1), (2) and (3).

With regard to C): The contacting of the active quantum dots has not been satisfactorily solved for other non-semiconducting material systems.

With regard to D): The previously known methods achieve at a maximum a smoothness of the structures, such as can be achieved with the manufacturing methods that are used, and, in this case, reference is also made here to the documents (1), (2) and (3).

OBJECT OF THE INVENTION

The present invention is based on the object of providing methods for the manufacturing of quantum structures or components with such quantum structures which satisfy the requirements A) to D) and which can, moreover, be economically and reliably manufactured, with the components, which are thereby formed, having a high degree of efficiency and reliability.

BRIEF DESCRIPTION OF THE INVENTION

In order to satisfy this object there is provided a method of manufacturing quantum structures, in particular quantum dots and tunnel barriers wherein a substrate is structured by the intentional formation of trenches so that material remains between oppositely disposed trench sections, with a transition from a broader region to a narrower region; wherein further material is deposited onto the substrate so that differential growth sets in on the remaining regions of the substrate and an inclined surface arises in the transition region between the broader region and the narrower region and a material height increase arises in the narrower region relative to the broader region; and in that a different material, or a material of different conductivity, is subsequently deposited, whereby a tunnel barrier is created on the inclined surface and/or a quantum dot is created at the upper end of the inclined surface.

A component in accordance with the invention and having a quantum structure, in particular a quantum dot and a tunnel barrier, is characterized by a substrate which is structured by trenches formed therein in such a way that between oppositely disposed trench sections material remains with a transition from a broader region to a narrower region, by a material deposited on the substrate which forms an oblique surface in the transition region between the broader region and the narrower region and an increase in material height in the narrower region relative to the broader region, and by another material or a material of different conductivity which forms a tunnel barrier on the inclined surface and/or a quantum dot at the upper end of the inclined surface.

An alternative method, which is very similar to the last-named method, but with the distinction that the inclined surfaces, and thus the tunnel barriers and the quantum dot, are formed in the trench region, wherein a substrate is structured by the intentional formation of adjoining trench regions of differing width, with a transition from a broader region to a narrower region; wherein a further material is deposited onto the substrate, so that a differential growth arises in the trench regions of the substrate, with an inclined surface arising in the transition region between the broader region and the narrower region and an increase in material height arising in the narrower region relative to the broader region; and wherein a different material or a material of different conductivity is subsequently deposited, whereby a tunnel barrier arises on the inclined surface and/or a quantum dot arises at the upper end of the inclined surface.

A component resulting from this alternative method is characterized by a substrate with adjoining trench regions of differing width, with a transition from a broader region to a narrower region, by material deposited on the substrate and having an inclined surface in the transition region between the broader region and the narrower region and an increase in material height in the narrower region relative to the broader region; and by another material or by a material of different conductivity which forms a tunnel barrier on the inclined surface and/or a quantum dot at the upper end of the inclined surface.

The present invention builds on the already known recognition that the epitaxial growth in the region of the edges of etched trenches or grooves on semiconductor substrates takes place as a result of surface diffusion processes in such a form that inclined surfaces arise at the edges of the etched trenches. It is known that when two trenches extend parallel to one another the layer which forms during epitaxial growth on the surface of the substrate between the two trenches adopts a trapezoidal shape in cross-section with suitable choice of the growth conditions.

Instead of two trenches extending parallel to one another, the present invention, however, uses trenches which have a special course relative to one another in order to hereby intentionally structure the substrate and to control the formation of inclined surfaces in a special way and means so that tunnel barriers and/or quantum dots arise. The growth conditions can be more precisely explained with respect to a specific embodiment.

For this embodiment we will assume that two rectangular trenches are provided which stand opposite to one another point to point and which have a spacing from one another which can, for example, amount to 1 to $2\mu$. As seen in plan view, the substrate between the two etched, right-angled trenches then has approximately the shape of two triangles which stand point to point and overlap one another in the tip region, i.e. a material web or platform is formed which first converges up to a narrowest position between the tips of the two trenches and thereafter diverges again. One can say of this material web that it leads from a broader region via a convergent transition region to a narrower region and then via a second divergent transition region to a second broader region. If now an epitaxial growth process is commenced by the deposition of further material onto the so structured substrate, then a material elevation with inclined flanks forms in the region of the narrowest position between the points of the oppositely disposed trenches, with the inclined flanks leading to the tips of the trenches and with respective inclined surfaces which extend from the material elevation in the narrower region obliquely downwardly to the minimum height in the broader regions. That is to say, a type of pyramidic growth takes place which can be exploited in order to generate special quantum structures.

If namely a different material, or a material of different conductivity, is deposited onto the substrate prior to completion of the pyramid, then a relatively narrow layer arises on the inclined surfaces, whereas this layer has the pyramid shape at the tip of the pyramid. The relatively thin layer of the further material on the inclined surfaces represent respective tunnel barriers, while the pyramid-shaped accumulation of the further material at the upper end of the inclined surface forms a quantum dot.

The relatively thin layers on the inclined surfaces are bounded at the left and the right by the trenches and can, for example, be contacted by electrodes in the broad regions of the web. Gate electrodes can also be provided in the respective right-angles trenches and have a spacing from the walls of the trenches, with the gate electrodes being capable of controlling the filling state of the quantum dot. It is not necessary to provide two gate electrodes, but rather it is sufficient to provide one gate electrode within the boundary of only one of the etched trenches. In this manner, one obtains a structure which can be operated as a transistor, with the contacting of the one broader region forming a source electrode and the contacting of the other broader region forming a drain electrode and with the gate electrode, or the gate electrodes, controlling the conductive path between the source and drain electrodes. The Fermi level of the quantum dot can be raised or lowered by the control voltage applied to the gate electrode, and indeed such that with alignment of the quantized energy level, with the energy level in the tunnel barriers, electrons can be transported through the so-formed channel, whereas, in the absence of alignment of the energy level, the electrons are however held fixed in the quantized energy levels in the quantum dot and block the path of the channel from the source electrode to the drain electrode.

As a rule, further material is not deposited in the form of a single material, or a single material composition, which would, however, basically be possible, but rather two different material compositions are deposited in the form of a plurality of alternating layers for the formation of buffer layers.

It can be seen from the preceding description that tunnel barriers arise on the two inclined surfaces and a quantum dot arises at the top end of the inclined surfaces. This special embodiment then comes about when, as described, the web of material between the two trenches extends from a broader region via a convergent transition region to a narrower region and from there, via a divergent transition region, to a broader region. If only a divergent transition is provided from a broader region to the narrower region, or a divergent transition from a narrower region to a broader region, then only one inclined surface with a tunnel barrier on the inclined surface arises. This quantum structure is, however, useful per se because one gate electrode can be provided to control the third tunnel barrier formed in the region of the inclined surface, and indeed either in the form of a gate electrode arranged above the other material and separated from the latter by at least one insulating layer which at least partly covers the tunnel barrier in the transition region, or in the form of a gate electrode arranged on the rear side of the substrate.

It would also be possible to control this tunnel barrier with an in-plane gate electrode which is arranged in a region bounded by one of the trench sections.

With a design of this kind both the broader region at the lower end of the tunnel barrier and also the narrower region at the upper end of the tunnel barrier can be contacted and the tunnel barrier can be so influenced by control through the gate electrode that it is either conductive or blocked.

Although in the preceding example the trenches have the shape of right angles standing opposite to one another point to point, the boundary lines of the trenches can also have other shapes for the formation of the structured regions of the substrate. They can, for example, have the shape of two corners arranged spaced apart from one another point to point or the form of a straight line and one angle lying opposite to and spaced apart from the latter, or they can have the shape of two mutually curved, spaced apart lines or the shape of two mutually oppositely disposed and spaced apart lines forming parts of rectangles or polygons.

These different possible shapes can also lead to the broader region and the narrower region as well as the transition regions being very short or being elongated, whereby the precise topology of the structures generated can be varied within wide limits. It is, for example, also possible through intentional design of the boundary lines of the trenches, if necessary also in combination with other measures, such as, for example, the choice of the material deposited and the temperature of the method, to so control the growth process that only one quantum dot arises at the top end of the pyramids, but so that the tunnel barriers are omitted. A structure of this kind would, for example, be useful for optical applications.

It is not only possible to generate the pyramid structure which has been discussed on the web region between two trenches but rather a pyramid structure of this kind can also be generated in the region of the trenches themselves with appropriate profiling of the trench sections.

The direct synthesis of tunnel barriers and quantum dots by epitaxial growth over pre-structured substrates in accordance with the invention enables the reproducible manufacture of tunnel barriers and quantum dots with a size in the nanometer range, with the quantum dot size being smaller by orders of magnitude then the size of the structure which is determined by the lithographic method for the manufacture of the trenches. It is essentially decisive for the quality of the so manufactured quantum structures that for the manufacture of the atomic structure, atomic diffusion processes are used, whereby the manufacture of quantum structures with atomically smooth boundary surfaces embedded in a matrix is possible.

The new method is characterized above all by its simplicity in the manufacture of the active quantum dots of single electron transistors. Thus, the active quantum dots are realized by the epitaxial growth over a narrow position on a pre-structured substrate. The manufacturing of this narrow position can take place with optical lithography, with the structuring likewise taking place by a standard process, for example by a dry etching process. If epitaxial growth is effected over the so manufactured narrow position, then the size of the quantum dot formed during growth at the narrow position, and also the size of the tunnel barriers, can be set in a defined manner by a suitable choice of the layer composition and also by the growth conditions. The self-organizing formation of the quantum dot at the narrow position is based on the principle that during layer growth surfaces form at the edges of the pre-structured substrate which are tilted relative to the substrate surface. Surface diffusion processes now cause the layer growth to be reduced on these tilted surfaces, whereas it is increased on the surfaces parallel to the substrate surface. At the center of the narrow position, the growth rate perpendicular to the substrate surface is increased to the greatest degree because here diffusion processes from two tilted side facets contribute to the growth rate increase. In this way, a plateau elevated relative to the remaining surface can be realized at the center of the narrow position. If the active layer is now grown onto the structure, then surface diffusion processes of atoms from the side facets onto the plateau result in the formation of a quantum dot on this plateau. This quantum dot has a greater thickness in the growth direction then the thickness of the epitaxial layer in the region of the drain and source and can be fully embedded in a matrix by further growth. Through the reduced growth on the side facets, the tunnel barriers which have been discussed can be realized on the latter.

The so manufactured quantum dot has a size in the nanometer range, has atomically smooth boundary surfaces, is bound into an insulating matrix to avoid disturbing surface effects and can easily be charged and discharged through the feedlines which are likewise formed during growth. A single gate is fully sufficient to control this individual electron transistor, with it being possible to realize this gate either at the side directly during growth or as a top or back gate. The new method also permits the realization of a plurality of coupled quantum dots in one working step, whereby the manufacture of complex logic circuits and detectors is made possible.

The new method offers advantages in all points A to D. With regard to point A, all process steps are standard steps in the industrial production of semiconductor components and can thus be incorporated in suitable manner in the overall manufacturing process of highly integrated circuits. Optical lithography is sufficient as a lithographic process, which has the advantage that the material is not damaged. The method can also be used on various material systems, such as GaAs, InGaAs, InP, SiGe and also related semiconductor systems and thus be used both for optical components, for electrons and electrometers and also for logic circuits.

With regard to point B, the new method opens the path to the highest levels of integration of individual electron transistors because the "confinement" of the active quantum dot is already present and one gate is fully sufficient to control the individual electron transistor.

With regard to point C, the manufacture of contacts using a standard process based on optical lithography is possible.

Finally, with regard to point D, it is explained that the new method exploits diffusion processes on an atomically smooth scale which contribute to the fact that all boundary surfaces are atomically smooth. As a rule, crystallographic planes form during these diffusion processes which correspond to a most densely packed plane, for example {111}, {311} planes, which are thus particularly suitable as boundary surfaces, as TEM investigations have shown (TEM= Tunnelling Electron Microscope). Since the layer growth takes place after structuring, the active quantum dot is not exposed to any radiation (for example during electron beam exposure), or to any other damaging influences (such as, for example, during etching or FEB writing). Smaller disturbances of the pre-structured starting substrate are largely eliminated by the surface diffusion processes so that they can no longer have any influence on the quantum dot.

A particular advantage of the new method is that there is in principle no minimum size of the quantum dot, since the quantum dot is formed by a self-organization process and its form does not have to be preset. Furthermore, this method makes it possible to fully embed the quantum dot in a matrix so that, on the one hand, no disturbing surfaces states arise and, on the other hand, the confinement can be precisely set. The decisive advantage is, however, that atomic processes (surface diffusion processes are exploited to manufacture atomic structures. Thus, the manufacture of atomically smooth surfaces is made possible with different crystallographic orientations.

DESCRIPTION OF PREFERRED EXEMPLARY EMBODIMENTS

Figure 1:
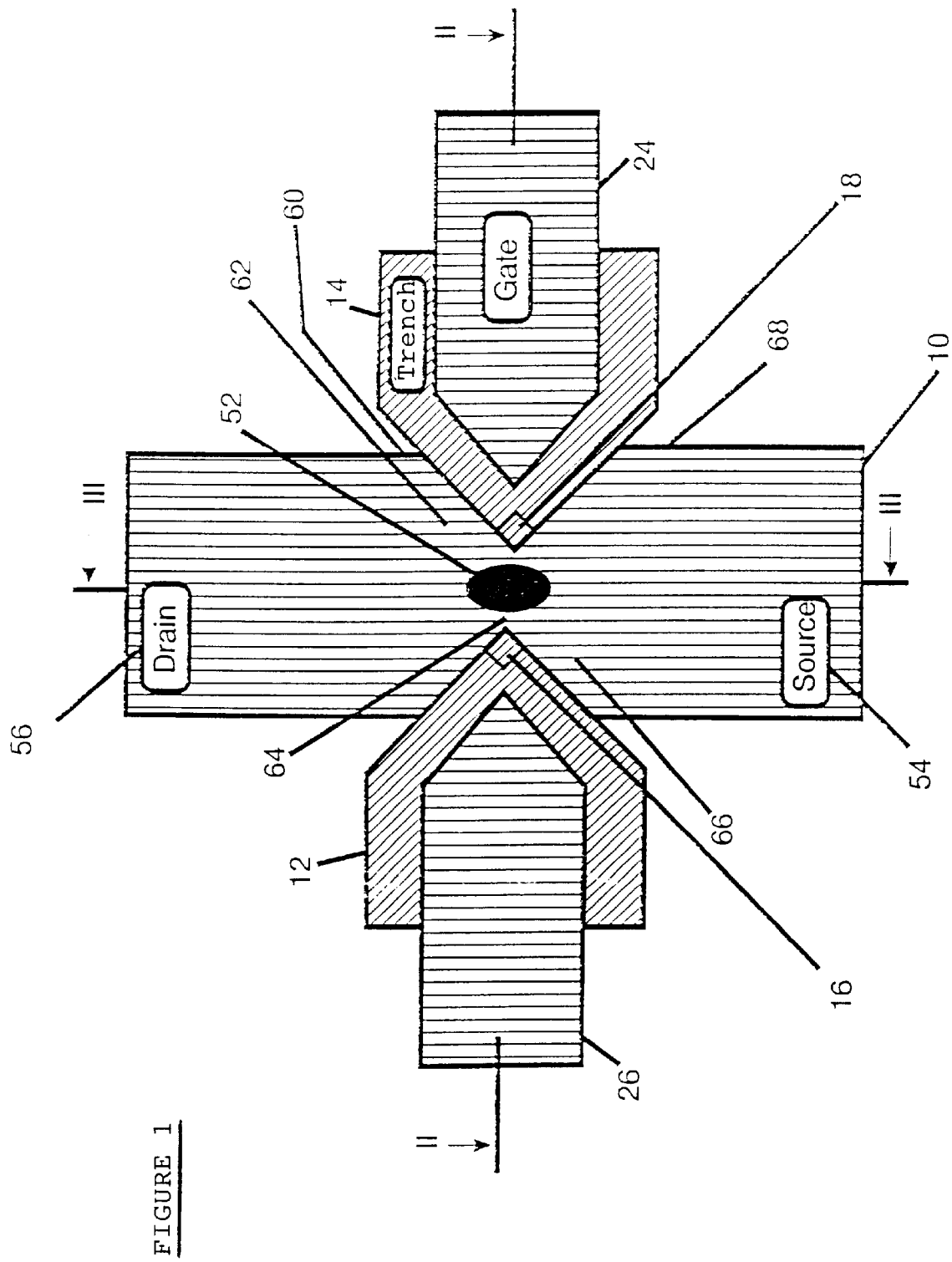
FIG. 1 is a schematic plan view of a substrate to explain the basic concept of the invention.

Referring to FIG. 1 one can see a plan view of a substrate 10 which was structured in accordance with the invention by means of two trenches 12 and 14, with a plurality of layers subsequently being deposited onto the so structured substrate as can be more precisely seen from FIGS. 2 and 3.

It can first be seen from FIG. 1 that both the trench 12 and also the trench 14 are approximately of U-shape and each have the shape of a right-angled angles 16 or 18 in the base region of the respective U-shape, with the angles 16 and 18 pointing towards each other point to point, but having a distance from one another which can, for example, amount to $0.5\mu$. Through these U-shapes of the two trenches 12 and 14, two web regions 20, 22 remain within the outer boundary of the U-shape as shown in FIG. 2 and on which finally the gate electrodes 24, 26 of FIG. 1 are applied. An elevated web or platform region 28 also lies between the oppositely disposed trenches which can likewise be from FIG. 2.

Figure 2:
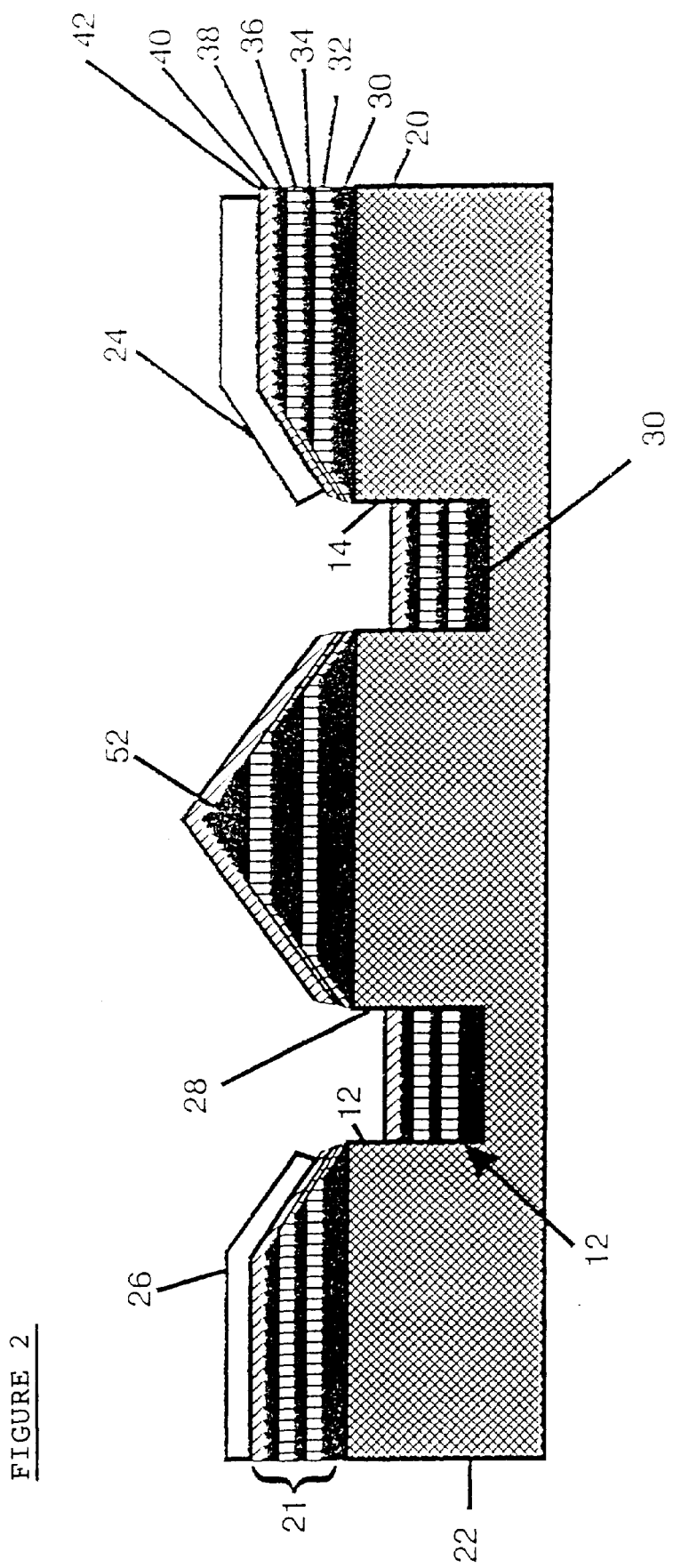
FIG. 2 is a cross-section through the substrate of FIG. 1 at the section plane II—II.
Figure 3:
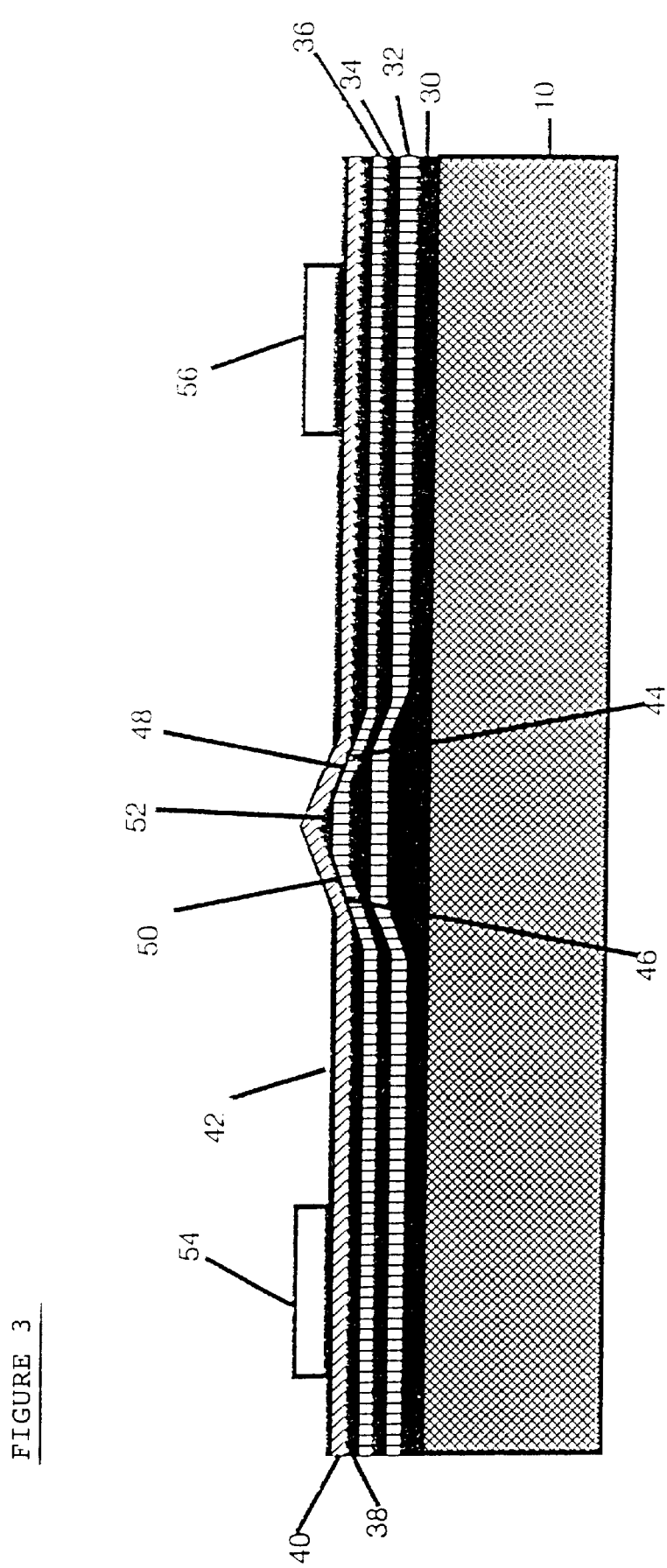
FIG. 3 is a cross-section through the substrate of FIG. 1 at the section plane III—III.

As can be seen from FIGS. 2 and 3, alternating layers of further material of two different compositions are deposited onto the so structured substrate which consists in the present example of GaAs. The first layer 30 consists of gallium arsenide, the second layer 32 of aluminium gallium arsenide, the third layer 34 of further gallium arsenide, the fourth layer 36 of aluminium gallium arsenide, the fifth layer 38 of further gallium arsenide, the sixth layer 40 of n-doped aluminium gallium arsenide and the top layer 42 again of gallium arsenide. As a result of the modulation doping of the layer 40, a two-dimensional electron gas arises at the boundary surface to the layer 38.

In a practical embodiment further alternating layers will preferably be provided. In a specific example the layer construction is as follows:

First, a layer of 100 Å thickness of GaAs is grown at 520° C. onto a customary (100) GaAs substrate. The temperature is then increased to 570° C. in order to heat the structure (annealing process). Thereafter, a 35-period superlattice buffer structure is deposited at 540°, with each period consisting of a 19 Å layer of AlAs and a 38 Å-GaAs layer.

Thereafter, the GaAs layer 38 of 200 Å thickness is grown out of the substrate. The AlGaAs layer 40 is deposited hereon, with the first 100 Å of this material being undoped and representing a so-called spacer layer, the following layer of 400 Å being doped with Si so that a 2 DEG with a two-dimensional charge density of $4.4 \times 10^{11}$ cm$^{-2}$ and a mobility $\mu$=7,600 cm$^2$ volt secs arises at room temperature in the unstructured region of the sample. The thickness statements apply to the unstructured region of the substrate. Finally, a GaAs layer with a thickness of 50 Å is applied as the cover layer 42. These many layers are not shown for the sake of simplicity in the FIGS. 2 and 3. Ultimately it would have also to be sufficient to form the layers 30–34 shown here entirely of GaAs and to dispense with the superlattice buffer layers.

One notes that the same layer sequence also arises in the trenches. These should be sufficiently deep that the filling up by the layer sequence does not reach to the surface of the substrate and does not influence the electrical characteristics of the component.

One can see from FIGS. 2 and 3 that the layers deposited on the substrate form a type of pyramid, and indeed with a special structure. It is evident from FIG. 3 that the upper boundary of the layer 36 forms two inclined surfaces 44, 46, with the layers of the material deposited on these inclined surfaces in the form of a GaAs layer being relatively narrow, whereby corresponding tunnel barriers 48 and 50 arise. At the center, directly below the tip of the pyramid, there is located a quantum dot 52 with an approximately triangular cross-section in FIG. 3, with the same dot 52 in FIG. 2 likewise having a triangular cross-section and the dot as a whole being considered as a small pyramid. At the side the tunnel barriers 48 and 50 are bounded by the trenches.

It can be further seen from FIGS. 1 and 3 that the layer 40 can be contacted to form drain and source electrodes 54, 56.

Figure 4:
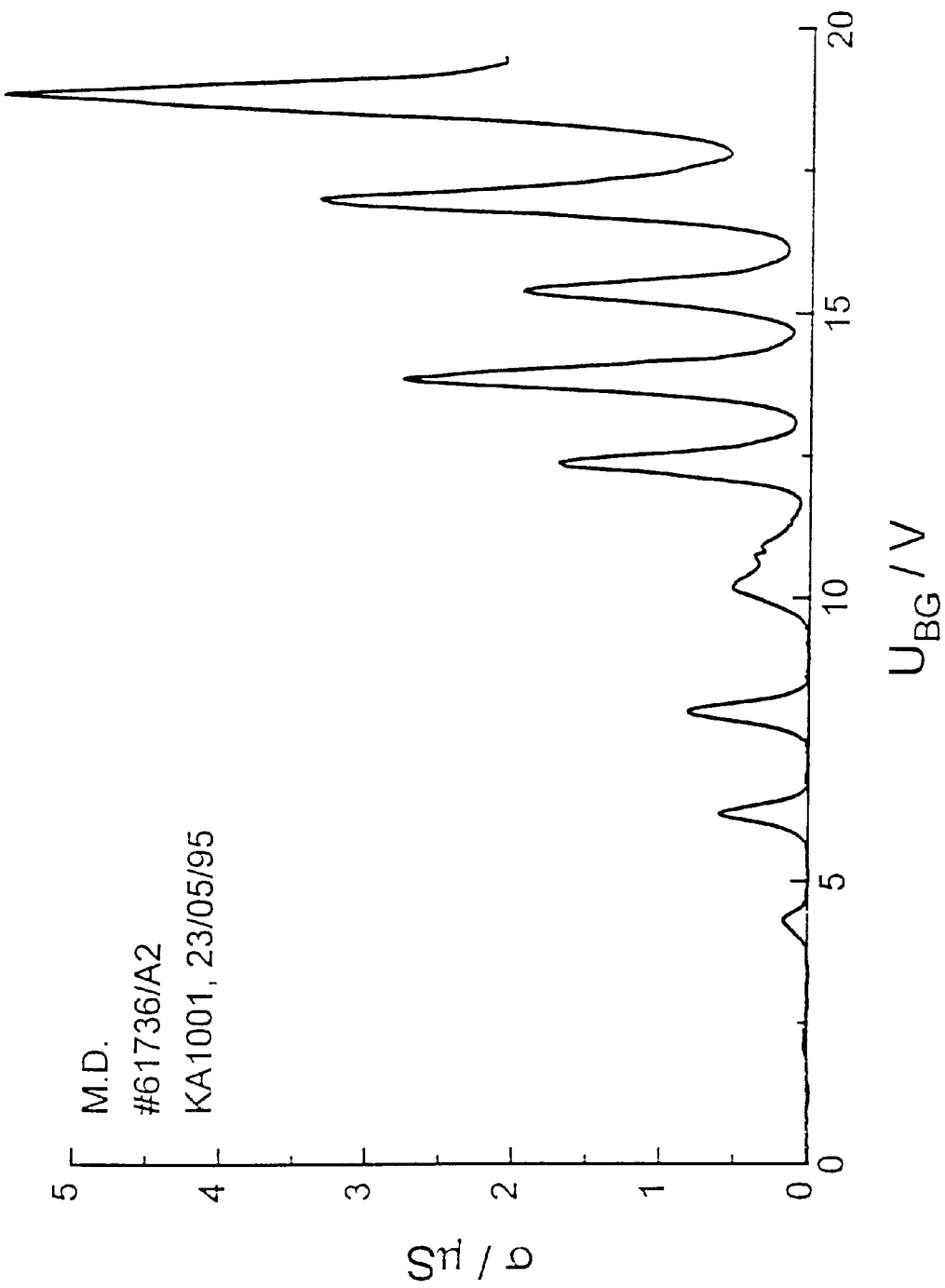
FIG. 4 is the result of a measurement showing the Coulomb blockade at a specific component in the form of a transistor corresponding to FIGS. 1 to 3.

The energy levels in the quantum dot 52 can be controlled by the application of a control voltage to one of the gate electrodes 24 and 26 respectively. Through the application of different voltages to the source and drain electrodes 54 and 56 and of suitable voltage at the gate electrode, one can align the quantized energy level in the quantum dot with the respective Fermi levels of the source and drain regions. In this way individual electrons can be received in the quantized energy states of the quantum dot from the source region and can pass from this level to the drain region and the drain electrode 56. One is concerned here with a quantum transport of individual electrons as is proved by FIG. 4 which shows the result of a specific measurement on a corresponding practically tested component. Here the transconductance in micro sieverts is recorded on the ordinate, whereas the gate potential $U_{BG}$ in volts is given on the abscissa. The respective peaks show voltages at which the so-formed transistor is conductive, whereas for gate potentials between the peaks the transistor is blocked. The Coulomb-blockade effect has been proved by this.

Although the just discussed example is realized in GaAs/AlGaAs the same principle can also be realized in other compositional semiconductor systems of the group III-V or of the group II/VI and semiconductors of the group IV, for example, silicon (with differential doping of individual layers) or the silicon/germanium system can likewise be realized in this manner. The possibility also exists of generating the material of the quantum dot 52 and of the tunnel barriers 48, 50 of different material from the selected system, for example, of metallic indium.

In the above recited example, two tunnel barriers with a quantum dot arranged between them are used in order to generate a transistor. For this purpose the material web 28 between the oppositely disposed trenches 12, 14 is so designed that it leads from a broader region 60 by means of a transition region 62 to a narrower region 64 directly between the oppositely disposed tips 16, 18 and via a second diverging transition region 66 to a second broader region 68. In this way the tunnel regions are formed in the transition regions 62 and 66, whereas the quantum dot 52 is formed in the tip region of the pyramid between the oppositely disposed tips of the trenches 12, 14.

It is, however, also possible to provide only one tunnel barrier and to control the latter by means of a corresponding gate electrode. As the tunnel barrier can be switched over between a conductive state and a non-conductive state, a controllable diode or a controllable switching element is also realized here, in principle, which can ultimately be considered as a transistor.

Figure 5:
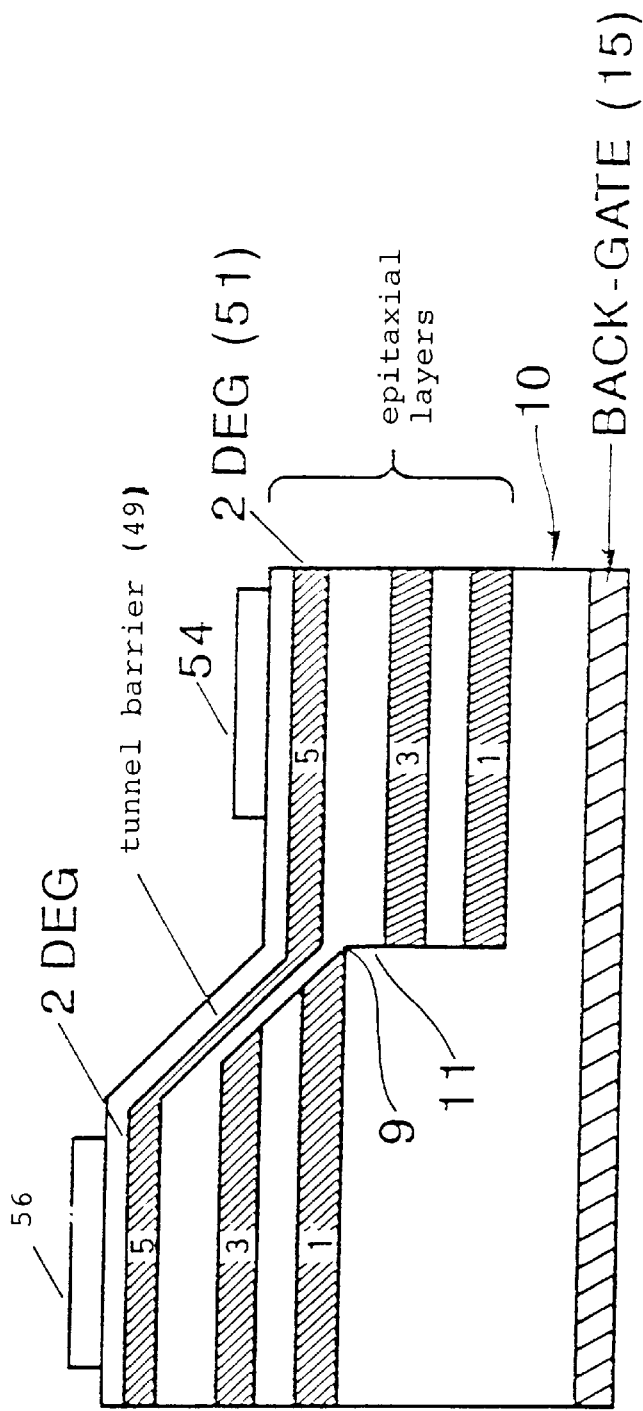
FIG. 5 is a cross-sectional drawing similar to a part of FIG. 2 to explain the tunnel barrier formed at the inclined surface with a back gate for the control of the latter.

In order to explain this point further, FIG. 5 first shows a further embodiment with a substrate 10 which has simply one step 11, which extends transversely to the plane of the illustration. During epitaxial growth an inclined course of the layers arises adjacent the edge 9, similar to the right hand half of FIGS. 2, so that a tunnel barrier 49 arises during layer growth of the previously described kind. The 2 DEG 51 generated by the epitaxial growth provides a connection to the source and drain electrodes 54, 56 at both ends of the tunnel barrier. To control the conductivity of the tunnel barrier, a gate electrode is applied here to the reverse side of the substrate in the form of a back gate 15.

Figure 6:
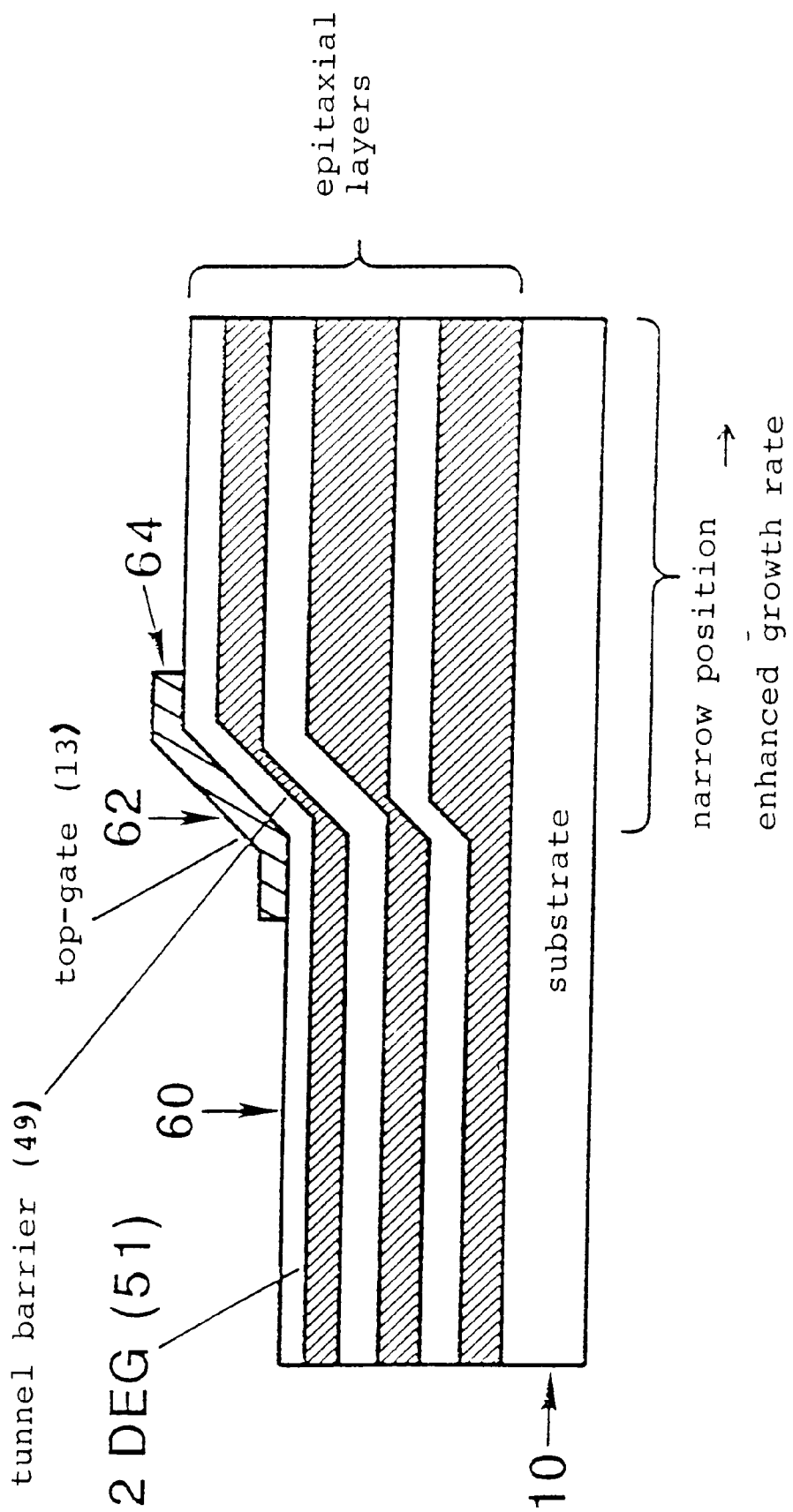
FIG. 6 is a drawing similar to FIG. 5, but with a top gate for the control of the tunnel barrier.

FIG. 6 shows a tunnel barrier 49 in the region of the inclined surface which arises on a web between two trenches when these trenches have the shape of the upper half of FIG. 1, i.e. the web has a transition 62 from a broader region 60 to a narrower region 64. The tunnel barrier 49 which arises during growth of the previously described layer sequence can be controlled by a top gate 13. In this case a gate electrode in the form of a back gate or of an in-plane gate can also be considered.

Figure 7:
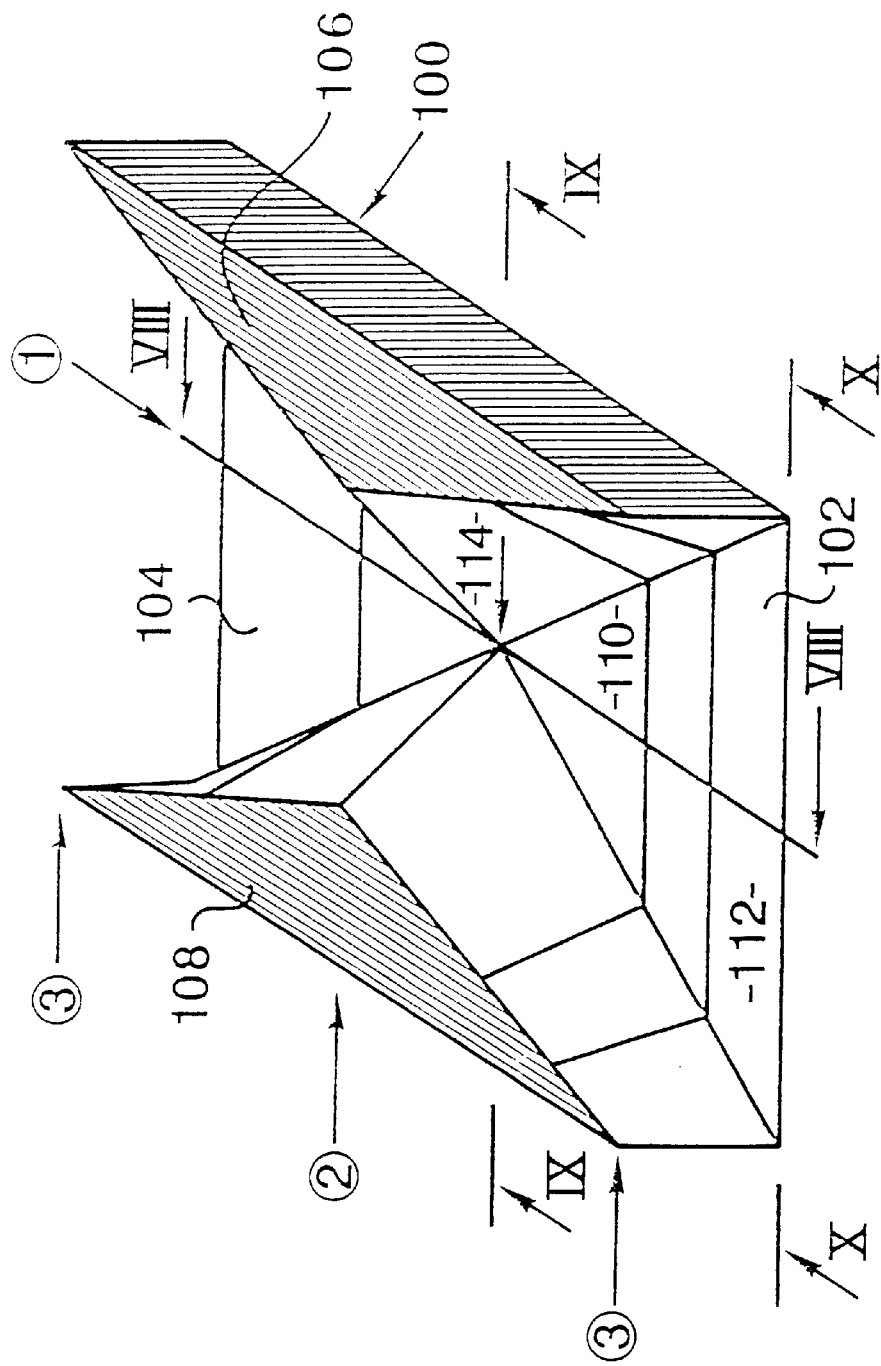
FIG. 7 is an alternative design of trenches for the formation of quantum dots at narrow positions within the trenches.

FIG. 7 shows an alternative possibility for realizing the concept of the invention.

Figure 8:
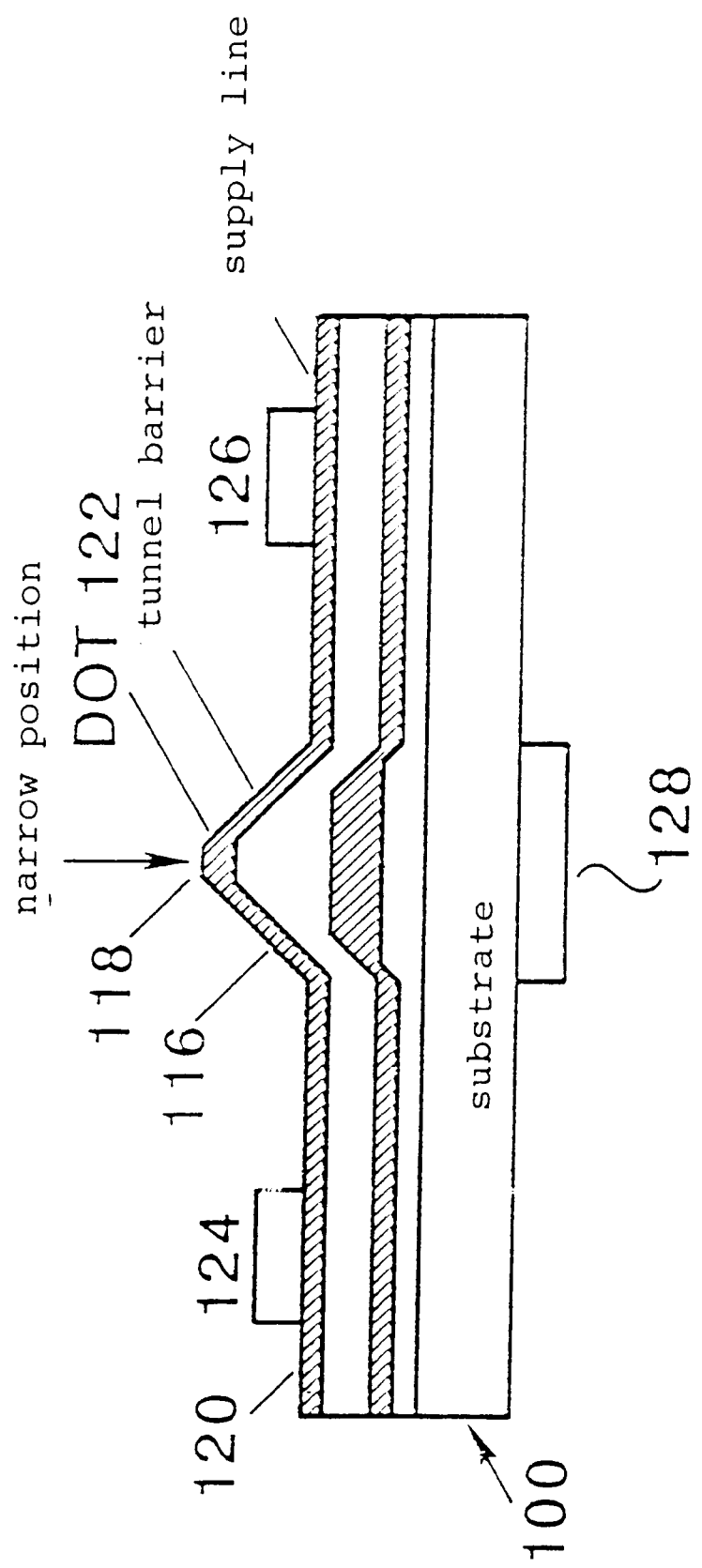
FIG. 8 is a cross-section through the substrate of FIG. 7 after the formation of a quantum dot, and indeed as seen in the sectional plane VIII—VIII.
Figure 9:
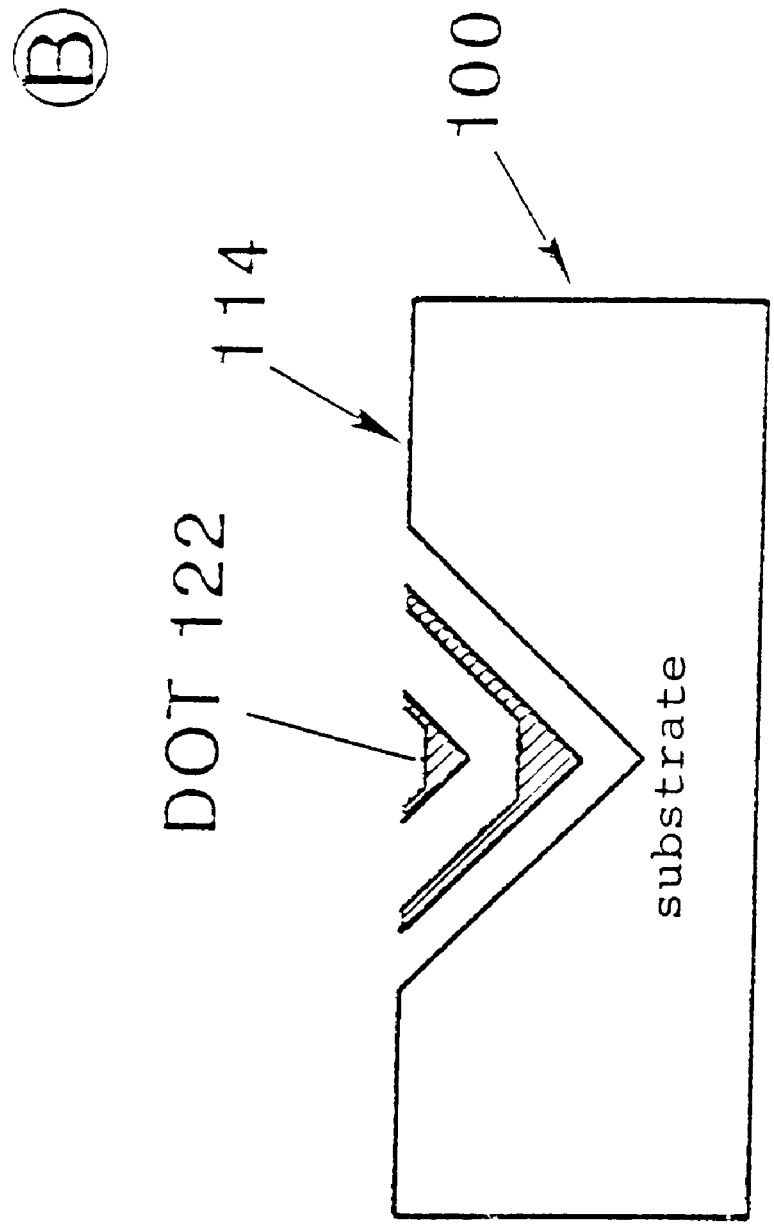
FIG. 9 is a drawing corresponding to FIG. 8, but as seen at the section plane IX—IX of FIG. 7.
Figure 10:
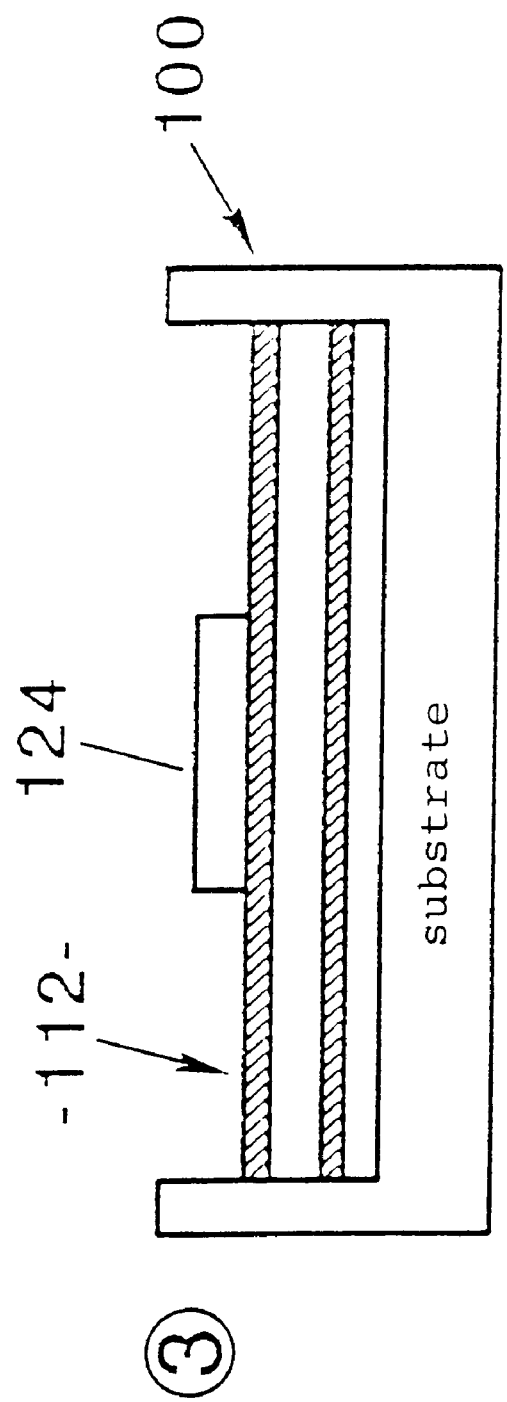
FIG. 10 is a sectional drawing similar to FIG. 8, but as seen at the section plane X of FIG. 7.

From FIG. 7 one can namely see a substrate 100 which was structured by the intentional formation of adjoining trench regions 102 and 104. Two web regions 106 and 108 remain, and in this example the sidewalls of the trench regions 102 and 104 do not extend perpendicular to the floor of the trench regions 102, 104 but rather obliquely thereto, which preferentially encourages the formation of the desired pyramid structure of the invention. In this embodiment in accordance with FIG. 7 this pyramid structure is formed by the deposition of the alternating layer sequence not only in the web regions 106, 108, but rather in the trench regions 102, 104 of the substrate at the narrow position. A different growth namely arises here in such a way that, as shown in the drawings of FIGS. 8, 9 and 10, an inclined surface 116 arises in the transition region 110 between the broader region 112 and the narrower region 114 of the trench and a material increase 118 arises in the narrower region relative to the broader region. A corresponding inclined surface arises at the second transition region on the other side of the narrower region 114 from the first transition region 110. Here also another material 120 or a material of different conductivity is subsequently deposited, whereby a tunnel barrier arises on the inclined surface 116 and/or a quantum dot 122 at the other end of the inclined surface. Source and drain electrodes 124, 126, and also a gate electrode can also be provided here. The so obtained pyramid structure is ultimately very similar to the pyramid structure of the embodiment of FIGS. 1 to 3, is, however, realized in the trench region instead of on a web between two adjacent trench regions. The same material systems and considerations apply as for the example of FIGS. 1 to 3.

Figure 11:
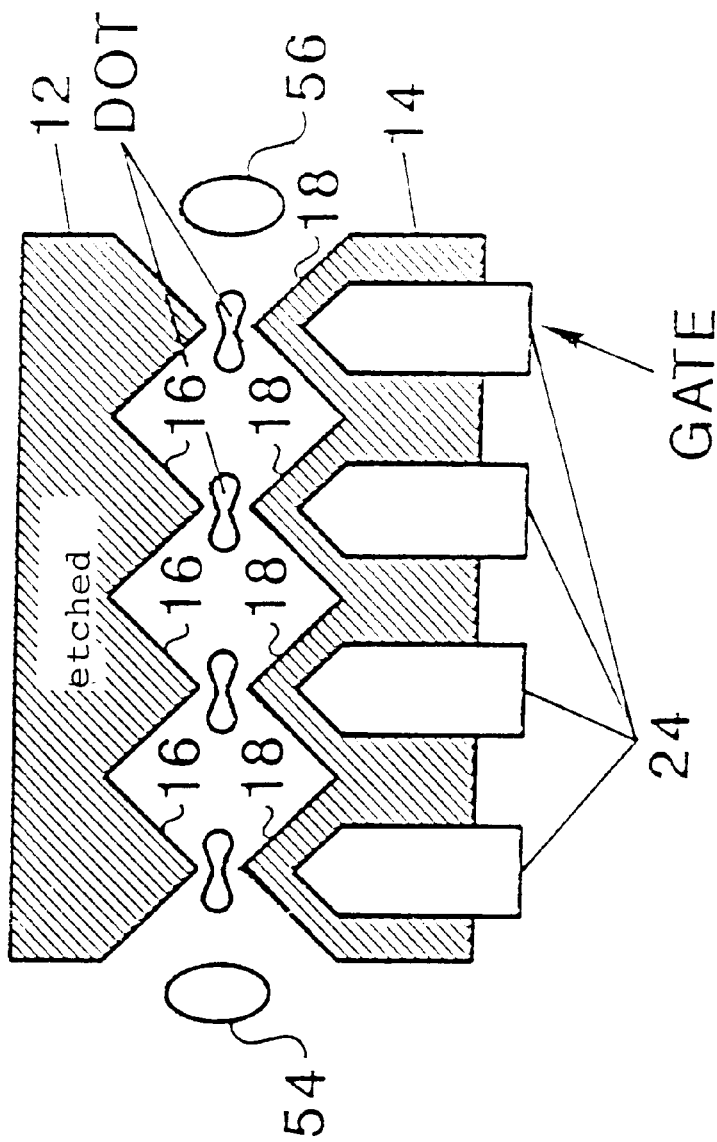
FIG. 11 is a schematic illustration of a series circuit.

The drawing of FIG. 11 shows a saw-tooth like formation of two trenches 12 and 14 which extend essentially parallel to one another, whereby quantum dots 52 are respectively formed between oppositely disposed points 16, 18 of the saw-tooth like trenches. Tunnel barriers are formed to the left and right of each quantum dot, but are not shown here for the sake of simplicity. A gate electrode 24 can be provided for each such quantum dot. One can imagine the series circuit as a type of shift register. Here source and drain electrodes 54, 56 are provided to the left and right of the illustrated series circuit.

Figure 12:
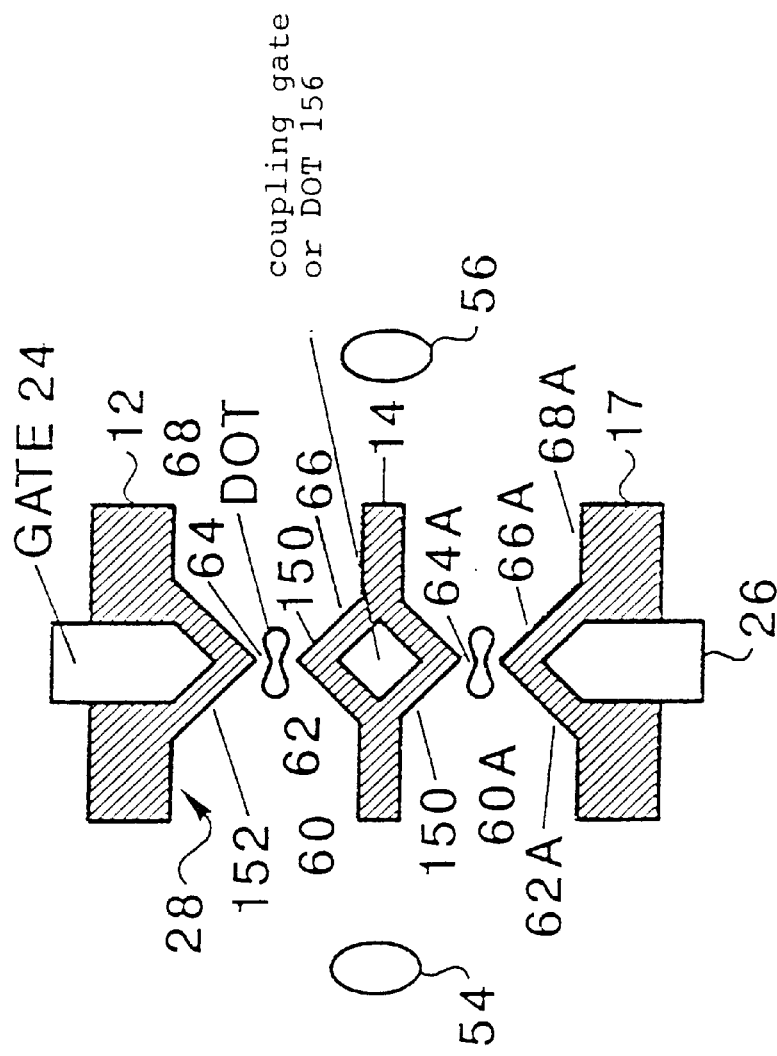
FIG. 12 is a schematic illustration of a parallel circuit.

FIG. 12 shows an arrangement in which three trenches 12, 14 and 17 extend substantially parallel to one another and are of similar design so as to form a parallel circuit.

The central trench region 14 has a corner-like boundary 150 which is arranged spaced from a corner-like boundary 152 of the trench 12 which is formed symmetrically thereto. In this way a structure is formed which is very similar to the structure of FIGS. 1 to 3, i.e. a first broader region 60 merges via a first convergent transition region 62 into a first narrower region 64 formed between oppositely disposed points of the trenches and subsequently merges via a second divergent transition region 66 into a second broader region 68. The structure on the other side of the central trench 14 is correspondingly formed and here a third broader region 60A can merge via a third convergent transition region 62A into a second narrower region 64A which finally merges via a divergent fourth transition region 66A into a fourth broad region 68A. Gate electrodes 12 are provided in the two trench regions 12 and 15 and a further coupling gate or further quantum dot is located on a web region at the center of the middle trench 14.

Figure 13:
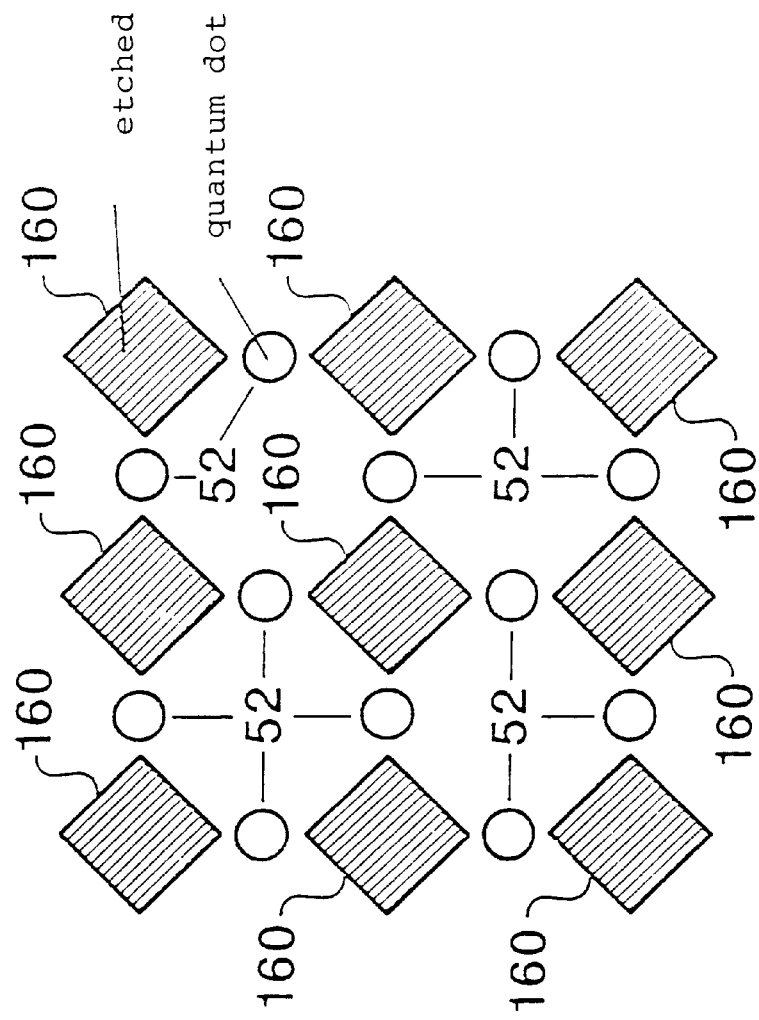
FIG. 13 is a schematic illustration of an array.

FIG. 13 shows how an array can be formed by a plurality of diamond-like trenches 160 which are arranged in a matrix arrangement in rows and columns, with dots 52 being formed between the confronting pointed corners of neighboring etched trenches.

It will be understood that the dots and tunnel barriers of FIGS. 11, 12 and 13 only arise when a layer construction is effected on the etched substrate as previously described.

Figure 14:
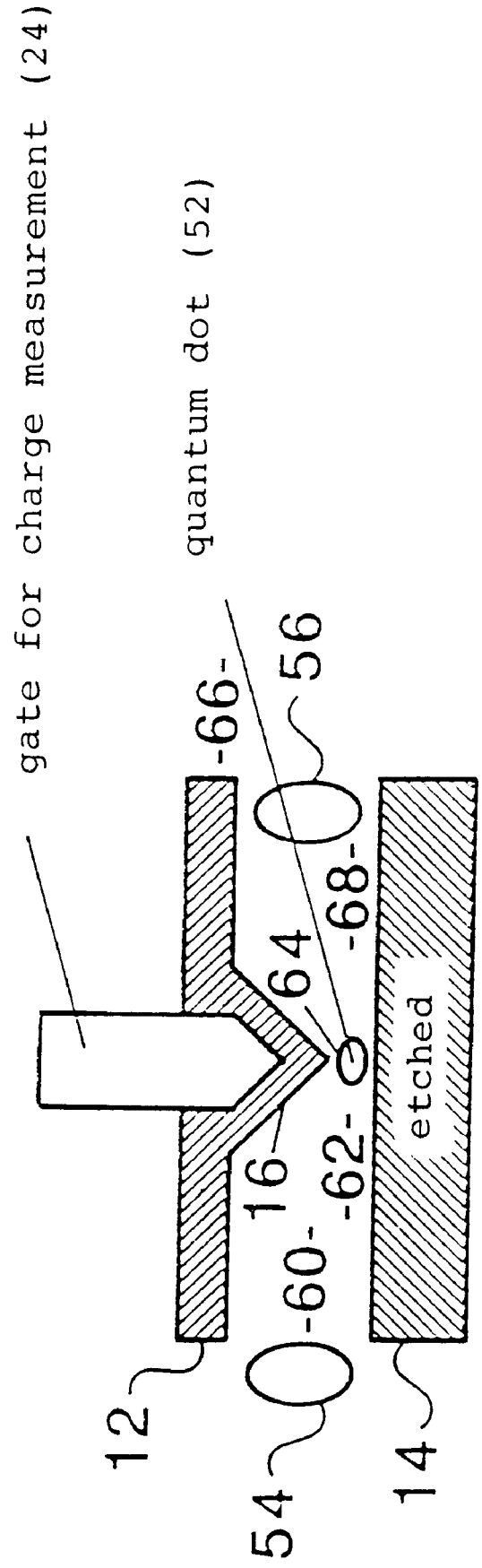
FIG. 14 is a schematic illustration of a component for charge measurement (electrometer)

As previously mentioned it is not necessary for the structuring of the substrate to be effected by two trench regions standing point to point. An alternative possibility of structuring the substrate is schematically illustrated in FIG. 14, where the trench 12 is an elongate trench with a pointed region 16, whereas the trench 14 has the shape of a trench with straight walls parallel to one another. After the deposition of further material corresponding to FIGS. 1 to 3, a pyramid structure arises between the point 16 of the trench 12 and the trench 14 with a quantum dot 52 at the narrower point in the vicinity of the point 16. Reference numeral 24 here signifies a gate electrode. Source and drain electrodes 52, 56 are also provided here.

Figure 15:
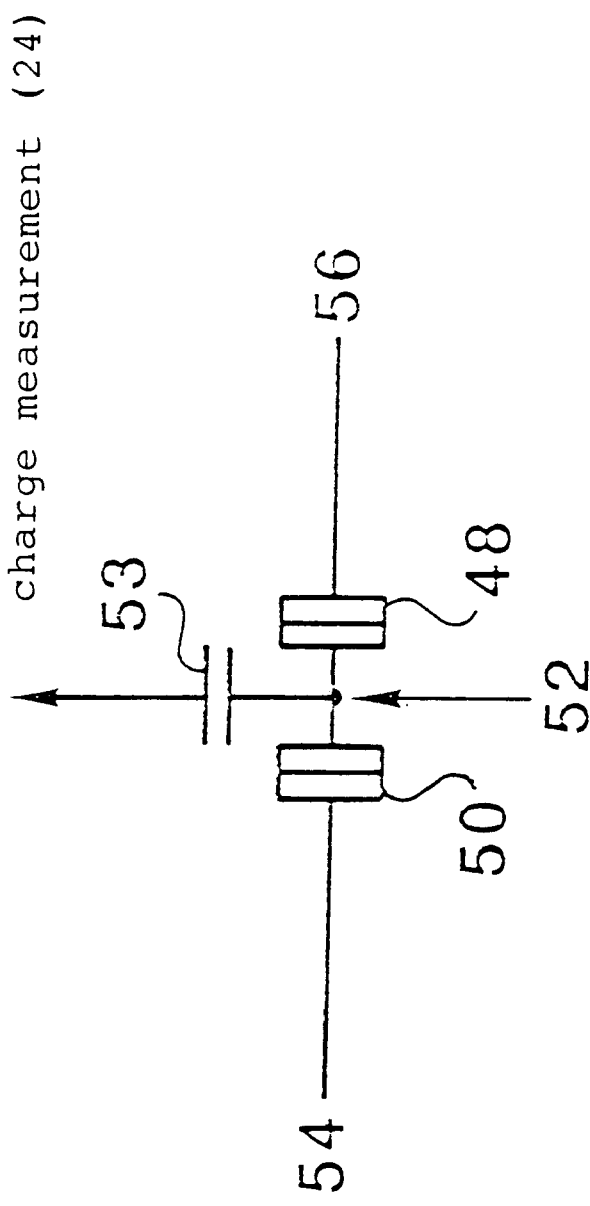
FIG. 15 is the equivalent circuit diagram of the component of FIG. 14.

The structure ultimately corresponds largely to the structure FIGS. 1 to 3, which is why the same reference numerals have been used here. In this case there is also a first broad region 60, a first convergent transition region 62, a narrow region 64, a second divergent transition region 66 and a second broad region 68. The components schematically shown in FIG. 14 of which the equivalent circuit diagram can be seen from FIG. 15 can be used for charge measurement. As can be seen from FIG. 15, the gate electrode 24 is capacitively coupled to the quantum dot 52 so the charge carriers which arise as a result of capacitive coupling of the gate electrode with the charge to be measured control the energy levels in the quantum dot and hereby control the conductivity of the channel formed between the drain and source electrodes 54, 56. To the left and the right of the quantum dot 52, there are also provided tunnel barriers 50, 48 which form the conductive channel, as can likewise be seen from the equivalent circuit diagram of FIG. 15.

Figure 16:
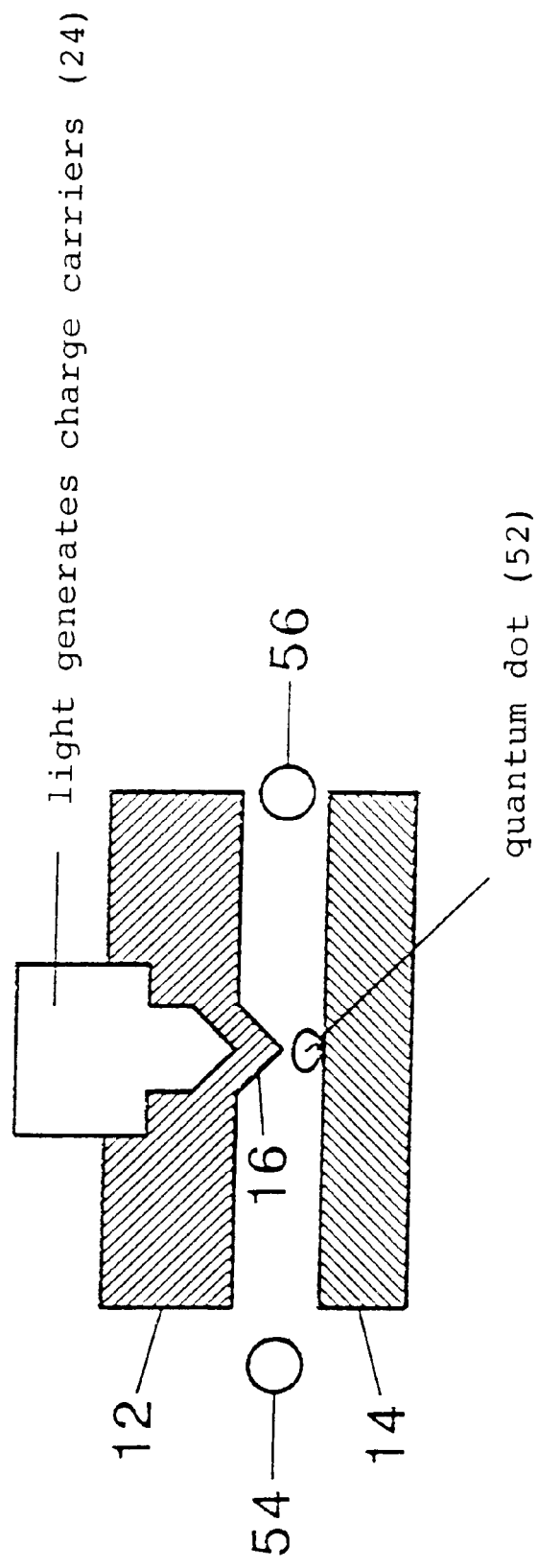
FIG. 16 is a schematic illustration of an opto-electronic component in the form of an optical detector.

FIG. 16 also shows a structure which largely corresponds to the structure of FIG. 14 which is why the same reference numerals are also used here. Here the element is, however, formed as an optical detector which is why a somewhat more areal design of the gate electrode is provided. If light falls on the gate electrode 24 then it generates charge carriers which in turn control the position of the energy level in the quantum dot 52 and the conductivity in the channel between the drain and source electrodes 54, 56. The same detector can also be used for the measurement of electromagnetic radiations of different kinds.

Figure 17:
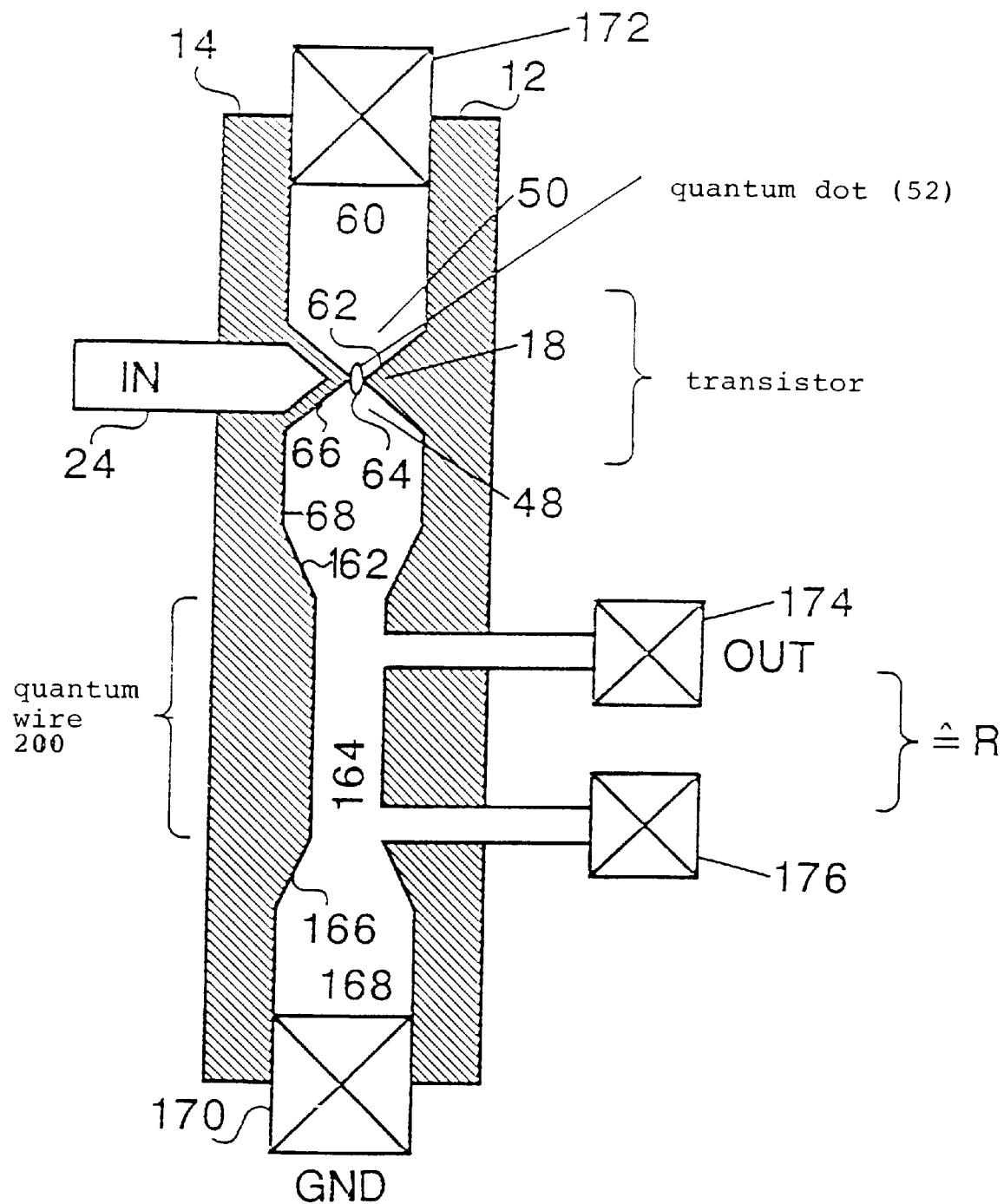
FIG. 17 is a schematic illustration of a component in the form of a transistor with an attached resistor.

FIG. 17 shows a design of two trenches 12 and 14 which is useful to produce the connection of a quantum dot 52 (transistor) with a quantum wire 200 (resistor) which can be exploited to realize integrated transistor circuits.

Here, the two oppositely disposed trenches 12 and 14 first form a broader region 60, then a convergent transition region 62, a narrower region 64, a divergent second transition region 66 and a second broader region 68. This is then followed by a second convergent transition region 162, which opens into an elongate narrow region 164, which is located between two trench edges which extend parallel to and spaced apart from one another. This narrower region 164 finally passes via a further divergent region 166 into a further broader region 168. As a result of the so effected structure of the substrate a quantum dot 52 is formed after epitaxial growth of layers, as previously explained, between the oppositely disposed points 16 and 18 with tunnel barriers 48 and 50 being present directly above and beneath the quantum dot 52 in FIG. 17. This part of the structure shown corresponds largely to the structure of FIGS. 1 to 3.

The second elongate narrower region 164 leads, after the deposition of the different material layers, to the formation of a quantum wire which represents a resistor. The electrode 170 represents an earth connection while the supply voltage is applied to the electrode 172. The input voltage is applied to the gate electrode 24 and the output voltage can be tapped off from the electrode 174 at the lower end of the tunnel barrier 48. A further electrode 176 can be provided at the lower end of the quantum wire with the resistance between the electrode 174 and 176 depending on the gate voltage applied to the gate electrode.

With an integrated circuit the signal will, for example, not be tapped off at the electrode 174, but rather applied via the lead system formed on the chip to further, similarly designed components in order to form integrated circuits.

Figure 18:
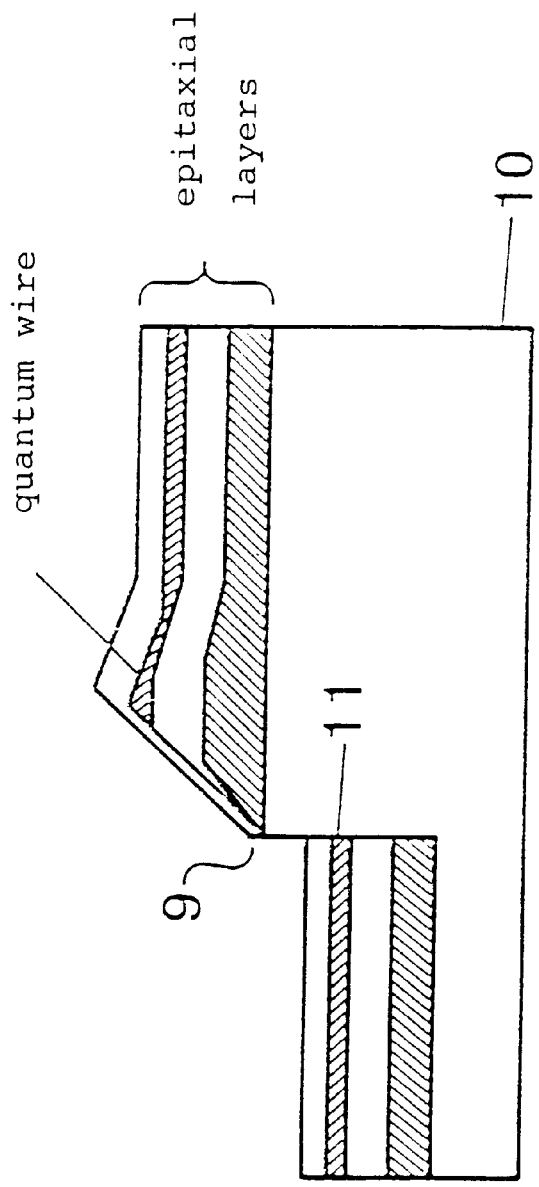
FIG. 18 is a schematic illustration of the formation of a quantum wire adjacent to the edge of an elongate trench.
Figure 19A:
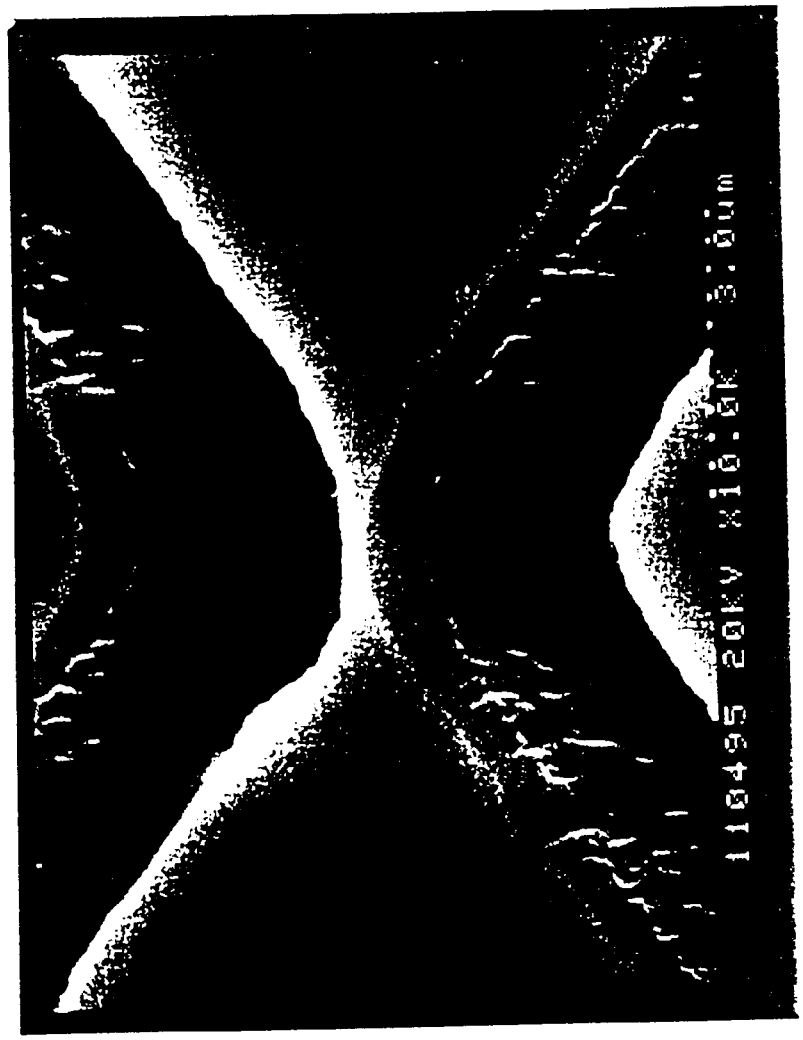
FIGS. 19A–C are Atomic-force microscope recordings of the surface topography of a structure of the invention in accordance with FIGS. 1 to 3.
Figure 19B:
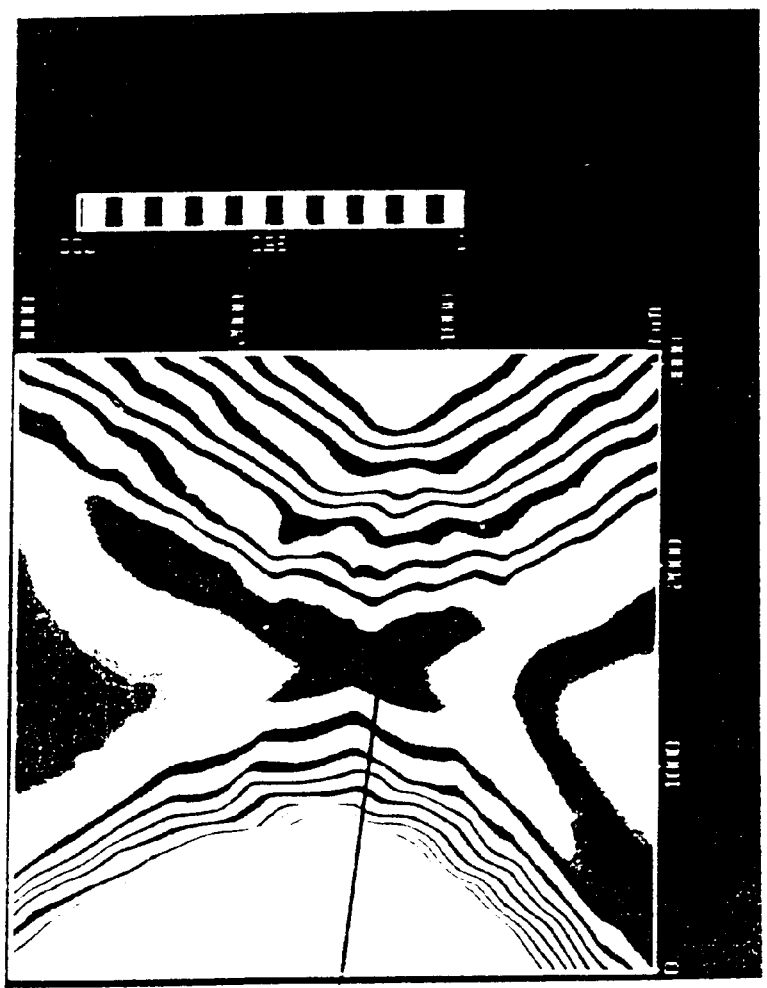
Figure 19C:
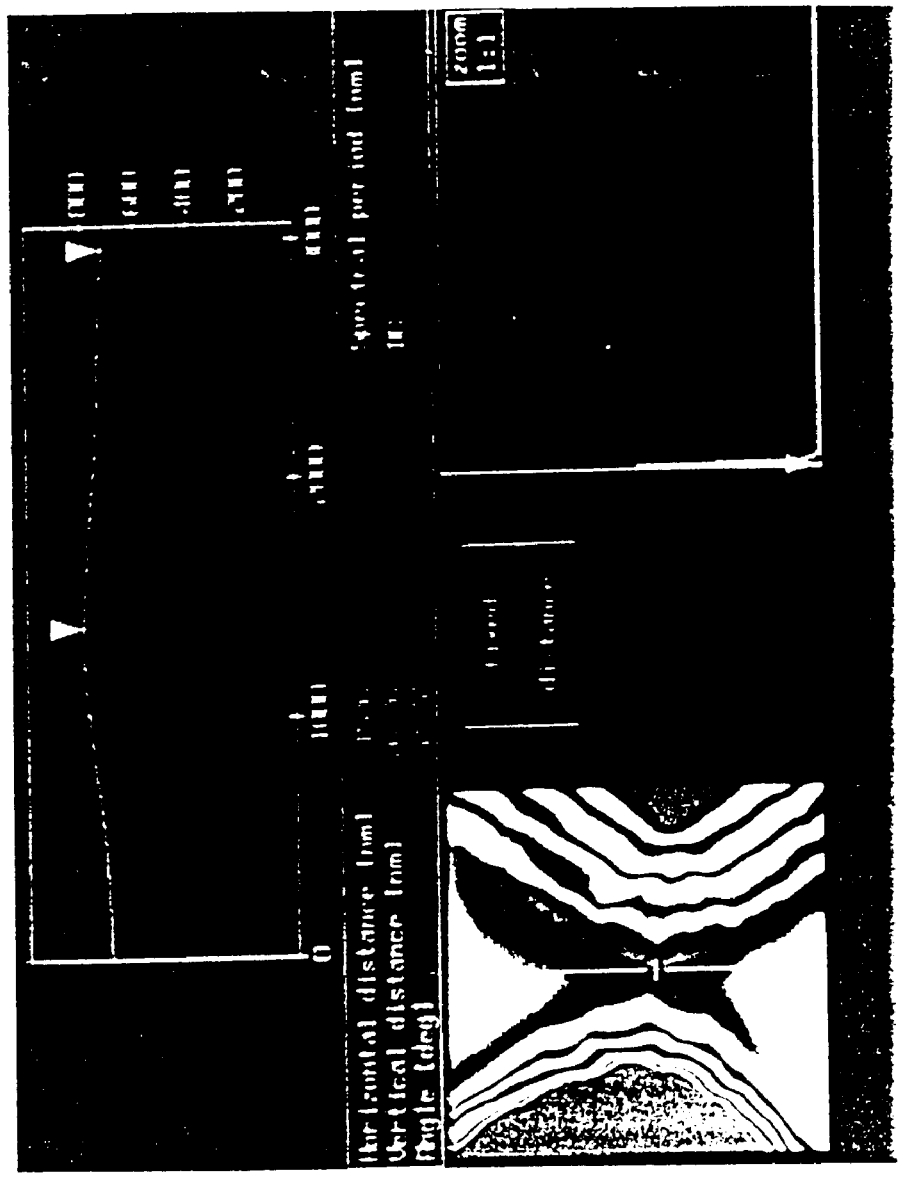

Finally, FIG. 18 shows how a substrate 10 structured by an edged step can be exploited to generate a quantum wire which extends here parallel to the edge 9 of the step 11. Here it is also necessary to select at least the basic layer build-up which is the determining factor for all embodiments, namely the epitaxial growth of a layer of a further material on the structured substrate, followed by a layer of another material or a layer of a material with different conductivity, whereby a 2 DEG arises at the boundary surface between the further material and the other material or the material of different conductivity.

By the doping of the further material (for example by modulation doping or by Dirac delta doping adjacent to the boundary surface of the upper layer) a comparatively thin layer of the other material arises on the inclined surfaces, whereby tunnel barriers are formed, whereas a thicker layer arises at the upper end of the inclined surface, which has restricted dimensions and thus forms a quantum wire. Many variants of this basic layer construction can, however, be realized. As previously described, the further material is preferably formed by an alternating sequence of two materials of different compositions. A material layer or several material layers can also be deposited onto the named other material layer or onto the named layer of material with other conductivity for better confinement, for passivation, for doping or for other purposes.

Components in accordance with the invention can be assembled together in the most diverse manners to form integrated circuits. Some examples as to how quantum structures can be assembled together in general to form integrated circuits, above all consisting of so-called single electron transistors for the realization of various circuits, for example, logic circuits, can be seen from the workshop report relating to the "Second International Workshop on Quantum Functional Devices" sponsored by FED", which was held from May 23 to May 25, 1995 in Matsue, Japan. Reference is made by way of example to page 5 of this report.

It should be noted that it is possible to realize the present invention using an abrupt transistion from a broader region to a narrower region. In this case the quantum dot will be formed at the beginning of the narrower region and the inclined surface will extend into the broader region adjacent the transition.

What is claimed is:

1. A method of manufacturing quantum structures, in particular quantum dots and tunnel barriers wherein a substrate is structured by the intentional formation of trenches so that material remains between oppositely disposed trench sections, with a transition from a broader region to a narrower region; wherein further material is deposited onto the substrate so that differential growth sets in on the remaining regions of the substrate and an inclined surface arises in the transition region between the broader region and the narrower region and a material height increase arises in the narrower region relative to the broader region; and wherein a different material is subsequently deposited, whereby a tunnel barrier is created on the inclined surface and/or a quantum dot is created at the upper end of the inclined surface.

2. A method in accordance with claim 1, wherein for the formation of buffer layers the further material is deposited in the form of a plurality of alternating layers of two different material compositions.

3. A method in accordance with claim 1, wherein the boundary lines of the trenches for the formation of the structured regions of the substrate have the form of two corners which are spaced apart from one another and stand point to point opposite one another, or have the form of a straight line and an angle lying opposite to and spaced from the line, or have the form of two mutually curved spaced apart lines, or have the form of two mutually oppositely disposed lines forming parts of rectangles or polygons.

4. A method in accordance with claim 1, wherein for the formation of a controllable tunnel barrier both the broader region and also the narrower region are contacted and a gate electrode is provided for controlling the tunnel barrier formed in the region of the inclined surface, and either in the form of a top-gate gate electrode arranged above the other material, separated from the latter by at least one insulating layer, and at least partially covering the transition region, or in the form of a back-gate gate electrode arranged on the rear side of the substrate, or in the form of an in-plane gate electrode which is arranged within a region bounded by one of the trenches.

5. A method in accordance with claim 1, wherein the trenches are so formed that the narrower region of the substrate is followed at the side opposite to the broader region by a second transition region and a second broader region; wherein at least one in-plane gate electrode is formed in one of the regions bounded by the trenches while the broader regions on opposite sides of the narrower region are contracted to form source-drain electrodes.

6. A method in accordance with claim 5, wherein for the formation of a transistor and an adjoining resistance, the structuring of the substrate through the trenches is effected so that a second narrower region is formed between oppositely disposed trench sections extending substantially parallel to one another, adjoining the second broad region and forming a quantum wire.

7. A method in accordance with claim 5, wherein the so formed component is used for charge measurement, wherein the gate electrode is capacitively coupled to the charge to be measured in order to influence the state of charge of the quantum dot.

8. A method in accordance with claim 5, wherein the gate electrode of the so-formed component is formed for reception of electromagnetic radiation, whereby an electromagnetic radiation detector, in particular an optical detector arises.

9. A method in accordance with claim 1, wherein by forming a plurality of trenches on a substrates a plurality of interlinked quantum structures is formed, whereby an integrated circuit, a highly integrated circuit, or a circuit executing a specific function arises.

10. A method in accordance with claim 5, wherein the second broader region is followed by a third transition region, by a second narrower region, by a fourth transition region and by a third broader region, with a respective gate electrode being provided for each narrower region, whereby a series circuit arises.

11. A method in accordance with claim 5, wherein a third trench is provided on the side of the second trench opposite to the first trench and forms, together with the second trench, a third broader region, a third transition region, a second narrower region and a fourth transition region and a fourth broader region which leads to a repetition of the structure to be formed and a gate electrode is provided in each trench adjacent to the associated narrower region, or adjacent to the associated narrower regions, whereby a parallel circuit is formed.

12. A method in accordance with claim 5, wherein a matrix arrangement of polygonal trenches is provided, with quantum dots being provided between oppositely disposed corners of adjacent trenches, with the quantum dots each having tunnel barriers on two sides, whereby an array arises.

13. A method in accordance with claim 1, wherein the quantum structures are formed in a semiconductor material system of the group III-V, or in a semiconductor material system of the group IV, or in a semiconductor material system of the group II-VI, with the material for the quantum dots or tunnel barrier layers also consisting of other materials.

14. A method for the manufacture of quantum structures, in particular quantum dots and tunnel barriers, wherein a substrate is structured by the intentional formation of adjoining trench regions of differing width, with a transition from a broader region to a narrower region; wherein a further material is deposited onto the substrate, so that a differential growth arises in the trench regions of the substrate, with an inclined surface arising in the transition region between the broader region and the narrower region and an increase in material height arising in the narrower region relative to the broader region; and wherein a different material is subsequently deposited, whereby a tunnel barrier arises on the inclined surface and/or a quantum dot arises at the upper end of the inclined surface.

15. A method in accordance with claim 14, wherein the side walls of the trench regions extend obliquely to the surface of the substrate, with oppositely disposed side walls preferably diverging from each other in the direction towards the surface of the substrate.

16. A method in accordance with claim 14, wherein for the formation of buffer layers the further material is deposited in the form of a plurality of alternating layers of two different material compositions.

17. A method in accordance with claim 14, wherein for the formation of the structured regions of the substrate the boundary surfaces of the trenches have the shape of two spaced apart corners which are disposed opposite to one another point to point, or the shape of a straight surface and an angle lying opposite thereto and spaced therefrom, or the shape of two mutually curved spaced apart surfaces, or the shape of two oppositely disposed and mutually spaced apart surfaces forming parts of rectangles or polygons.

18. A method in accordance with claim 14, wherein for the formation of a controllable tunnel barrier, both the broader region and also the narrower region are contacted and a gate electrode is provided to control the tunnel barrier formed in the region of the inclined surface, and indeed either in the form of a top-gate gate electrode arranged above the other material, separated from the latter by at least one insulating layer and at least partially covering over the transition region, or in the form of a back-gate gate electrode arranged on the rear side of the substrate, or in the form of an in-plane gate electrode which is arranged in at least one region bounded by one of the trench sections.

19. A method in accordance with claim 14, wherein the trench regions are so formed that the narrower region of the substrate is formed at the side opposite to the broader region, is followed by a second transition region and a second broader region; wherein an in-plane gate electrode is formed in at least one of the regions surrounded by one of the trench sections, while the broader regions on opposite sides of the narrower region are contacted to form source and drain electrodes.

20. A method in accordance with claim 19, wherein for the formation of a transistor and a subsequent resistor the structuring of the substrate by the trenches is so effected that a second narrower region forming a quantum wire is formed adjoining the second broader region between oppositely disposed boundary walls which extend substantially parallel to one another.

21. A method in accordance with claim 19, wherein the component so formed is used for charge measurement wherein the gate electrode is capacitively coupled to the charge to be measured in order to influence the state of charge of the quantum dot.

22. A method in accordance with claim 19, wherein the gate electrode of the so-formed component is formed to receive electromagnetic radiation, in particular light, whereby an electromagnetic radiation detector, in particular an optical detector arises.

23. A method in accordance with claim 14, wherein a plurality of interlinked quantum structures are formed by the design of a plurality of trench regions on a substrate, for example by the linkage of transistors each formed by two tunnel barriers with a quantum dot arranged therebetween, of resistors formed by quantum wires and of conductive connections between these transistors and resistors formed by sections of a 2 DEG, whereby an integrated circuit, a highly integrated circuit or a circuit executing a specific function, for example an amplifier or a frequency generator arises.

24. A method in accordance with claim 19, wherein the second broader region is followed by a third transition region, by a second narrower region, by a fourth transition region and by a third broader region, with a respective gate electrode being provided for each narrower region, whereby a series circuit arises.

25. A method in accordance with claim 19, wherein through the formation of a plurality of trench regions arranged parallel to one another one forms parallel to the first broader region, to the first transition region, to the first narrower region, to the second transition region and to the second broader region a third broader region, a third transition region, a second narrower region, a fourth transition region and a fourth broader region, wherein, depending on the number of the trench regions arranged parallel to one another a repetition of the so-formed structures is obtained and a gate electrode is provided on each web region of the substrate adjacent to the associated narrower region or adjacent to the associated narrower regions, whereby a parallel circuit is formed.

26. A method in accordance with claim 19, wherein a matrix arrangement of the so-formed structure is provided with web regions of the substrate remaining between the trench regions and with respective quantum dots being formed between adjacent web regions of the substrate, with the quantum dots having tunnel barriers on two sides, whereby an array arises.

27. A method in accordance with claim 14, wherein the quantum structures are formed in a semiconductor material system of the group III-V, or in a semiconductor material system of group IV, or in a semiconductor material system of the group II-VI, whereby the material for the quantum dots or tunnel barrier layers can also consist of other materials.

28. A method of forming a quantum wire by forming a step having an edge on a substrate, epitaxially growing at least one layer of further material on the structured substrate followed by a layer of another material or a layer of a material with different conductivity, whereby an inclined surface in the form of a facet arises on the top of said step extending away from said edge, due to a surface diffusion, and a quantum wire extending parallel to said edge forms at the upper end of said inclined surface.

29. A method in accordance with claim 9 wherein the plurality of interlinked quantum structures in formed by the linking of transistors each formed by two tunnel barriers with a quantum dot there between, of resistors formed by quantum wires, and of conductive connections between these transistors and resistors formed by sections of a two-dimensional electron gas.

30. A method in accordance with claim 9 wherein the specific function is one of either an amplifier or a frequency generator.

31. A method in accordance with claim 12 wherein the matrix arrangement consists of rectangular trenches.

32. A method in accordance with claim 13 wherein the semiconductor material system of the group III-V consists of one of either GaAs/AlGaAs, GaAs/GaInAs, or GaAs/GaAlInAs; the semiconductor material system of the group IV consists of one of either Si or SiGe; and the material for the quantum dots or tunnel barrier layers also consisting of metallic indium with the GaAs/GaAlInAs system.

33. A method in accordance with claim 1 wherein the different material is a material of different conductivity.

34. A method in accordance with claim 11 wherein further trenches are provided with the fourth broader region.

35. A method in accordance with claim 14 wherein the different material is a material of different conductivity.

36. A method in accordance with claim 27 wherein the semiconductor material system of the group III-V consists of one of either GaAs/AlGaAs, GaAs/GaInAs, or GaAs/GaAlInAs; the semiconductor material system of the group IV consists of one of either Si or SiGe; and the material for the quantum dots or tunnel barrier layers also consisting of metallic indium with the GaAs/GaInAs system.

* * * * *